United States Patent
Yamazaki

(10) Patent No.: US 8,847,220 B2
(45) Date of Patent: Sep. 30, 2014

(54) SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 96 days.

(21) Appl. No.: 13/543,109

(22) Filed: Jul. 6, 2012

(65) Prior Publication Data

US 2013/0015437 A1    Jan. 17, 2013

(30) Foreign Application Priority Data

Jul. 15, 2011    (JP) ................. 2011-156283

(51) Int. Cl.
*H01L 29/10* (2006.01)
*H01L 29/12* (2006.01)
*H01L 29/786* (2006.01)

(52) U.S. Cl.
CPC ................... *H01L 29/7869* (2013.01)
USPC ....... 257/43; 257/107; 257/E29.068

(58) Field of Classification Search
USPC ...................... 257/43, 107, E29.068
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |

(Continued)

FOREIGN PATENT DOCUMENTS

| | | | |
|---|---|---|---|
| EP | 1737044 A | 12/2006 | |
| EP | 2226847 A | 9/2010 | |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Michelle Mandala
(74) *Attorney, Agent, or Firm* — Eric J. Robinson; Robinson Intellectual Property Law Office, P.C.

(57) ABSTRACT

A semiconductor device including an oxide semiconductor can have stable electric characteristics and high reliability. A transistor in which an oxide semiconductor layer containing indium, titanium, and zinc is used as a channel formation region and a semiconductor device including the transistor are provided. As a buffer layer in contact with the oxide semiconductor layer, a metal oxide layer containing an oxide of one or more elements selected from titanium, aluminum, gallium, zirconium, hafnium, and a rare earth element can be used.

15 Claims, 12 Drawing Sheets

(56) References Cited

U.S. PATENT DOCUMENTS

| | | |
|---|---|---|
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,633,479 B2 * | 1/2014 | Choi et al. ............ 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0308806 A1 | 12/2008 | Akimoto et al. |
| 2008/0308826 A1 * | 12/2008 | Lee et al. ............ 257/98 |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0163865 A1 | 7/2010 | Arai et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2010-170110 | 8/2010 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

(56) References Cited

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amporphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide—Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

(56) References Cited

OTHER PUBLICATIONS

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-0721047-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

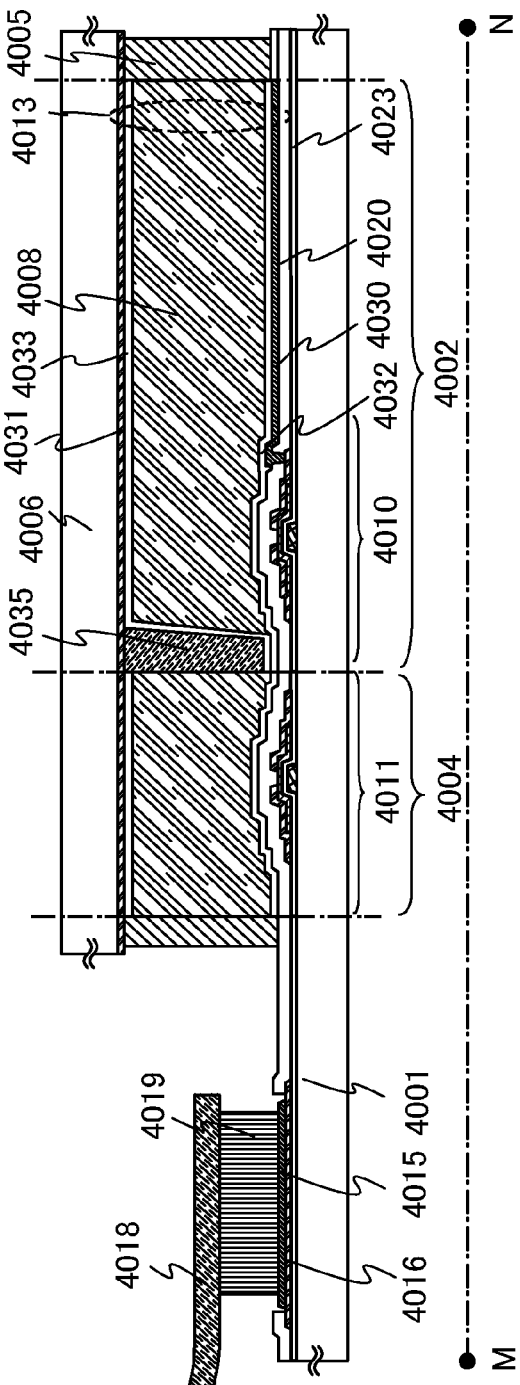
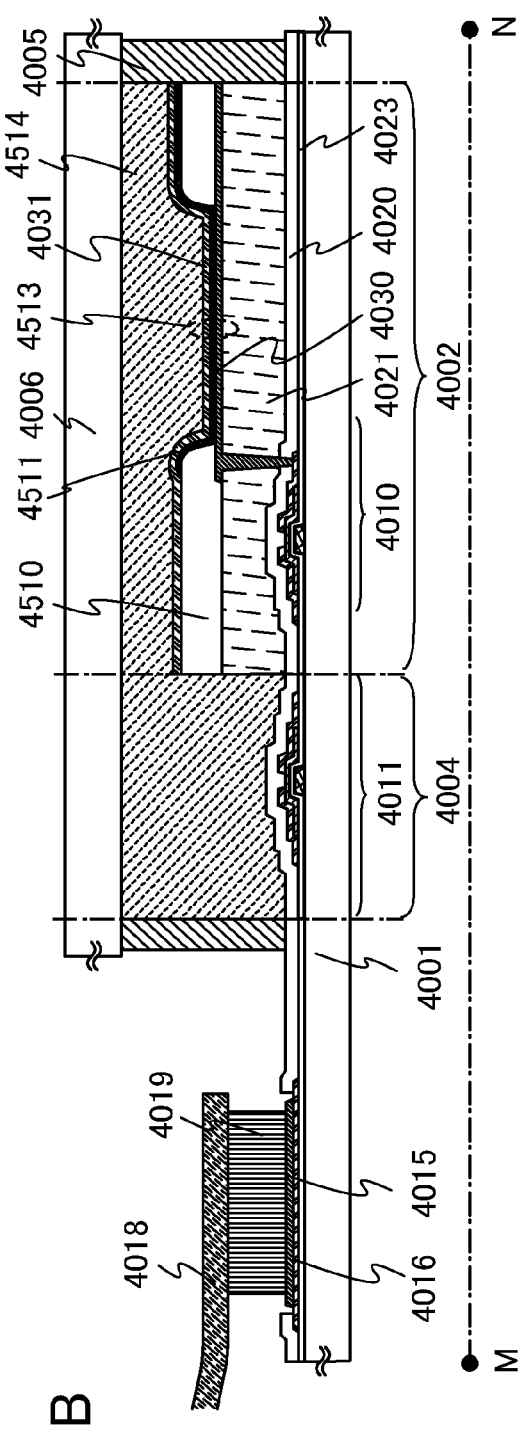
FIG. 10A
FIG. 10B

SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electro-optical device, a semiconductor circuit, and an electronic device are all semiconductor devices. For example, the present invention relates to an LSI; a CPU; a power device which is mounted on a power supply circuit; a semiconductor integrated circuit including a memory, a thyristor, a converter, an image sensor, or the like; an electro-optical device typified by a liquid crystal display panel; a light-emitting display device including a light-emitting element; and an electronic device including any of the above as a component.

2. Description of the Related Art

In recent years, semiconductor devices have been developed to be used as an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, or a memory is mounted on a circuit board, for example, a printed wiring board, to be used as one of components of a variety of electronic devices.

A technique for manufacturing a transistor or the like by using an oxide semiconductor film for a channel formation region has been attracting attention. Examples of such a transistor include a transistor in which zinc oxide (ZnO) is used as an oxide semiconductor film and a transistor in which $InGaO_3(ZnO)_m$ is used as an oxide semiconductor film. A technique for manufacturing such a transistor including an oxide semiconductor film over a light-transmitting substrate and applying it to a switching element or the like of an image display device is disclosed in Patent Documents 1 and 2.

In addition, a transistor including an In—Ti—O-based oxide semiconductor is disclosed in Patent Document 3.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2010-170110

SUMMARY OF THE INVENTION

An object of one embodiment of the present invention is to provide a structure of a semiconductor device which achieves high-speed response and high-speed operation by improving on-state characteristics (e.g., on-state current and field-effect mobility) of a transistor, and to provide a manufacturing method thereof, in order to achieve a high-performance semiconductor device.

Another object of one embodiment of the present invention is to provide a structure for suppressing generation of leakage current (parasitic channel) between a source electrode layer and a drain electrode layer of a transistor. To reduce leakage current of a transistor is important for obtaining a semiconductor device with low power consumption because leakage current of a transistor affects power consumption.

One embodiment of the invention disclosed in this specification is a semiconductor device including a transistor in which an oxide semiconductor containing a conductive metal oxide (typically, titanium oxide ($TiO_X$, X>0)) and one or both of indium and zinc is used as a channel formation region. A transistor in which an oxide semiconductor containing a conductive metal oxide is used as a channel formation region has excellent field-effect mobility.

One embodiment of the present invention is a semiconductor device including a buffer layer, an oxide semiconductor layer containing indium, titanium, and zinc (hereinafter referred to as In—Ti—Zn—O), which is provided on and in contact with the buffer layer, a gate insulating film over the oxide semiconductor layer, and a gate electrode layer overlapping with the oxide semiconductor layer with the gate insulating film positioned therebetween.

Another embodiment of the present invention is a semiconductor device including an oxide semiconductor layer containing indium, titanium, and zinc, and a first buffer layer and a second buffer layer provided so that the oxide semiconductor layer is sandwiched therebetween. As each of the first buffer layer and the second buffer layer, a film containing an oxide of one or more elements selected from titanium, aluminum, gallium, zirconium, hafnium, and a rare earth element can be used. Specifically, the following structure can be employed for example.

One embodiment of the present invention is a semiconductor device including a first buffer layer; an oxide semiconductor layer containing indium, titanium, and zinc, which is provided on and in contact with the first buffer layer; a second buffer layer provided on and in contact with the oxide semiconductor layer so as to cover a side surface of the oxide semiconductor layer; a gate insulating film provided over the second buffer layer; a gate electrode layer overlapping with the oxide semiconductor layer with the gate insulating film positioned therebetween; an insulating film which is provided over the gate electrode layer and has openings; and a source electrode layer and a drain electrode layer provided over the insulating film and electrically connected to the oxide semiconductor layer through the openings. The first buffer layer and the second buffer layer each contain an oxide of one or more elements selected from titanium, aluminum, gallium, zirconium, hafnium, and a rare earth element.

In the case where a silicon oxide film, which contains silicon that is a Group 14 element, is used as an insulating layer in contact with the oxide semiconductor layer, the interface between the oxide semiconductor layer and the silicon oxide film is less likely to be stable due to a difference in coordination number between the oxide semiconductor material and silicon oxide, and thus an interface state might be formed. In a transistor according to one embodiment of the present invention, a buffer layer is provided between an oxide semiconductor layer and an insulating layer, and an oxide (e.g., titanium oxide) containing a constituent similar to that of the oxide semiconductor layer is used for the buffer layer in contact with the oxide semiconductor layer; thus, formation of an interface state at the interface between the oxide semiconductor layer and the buffer layer can be prevented, and the transistor can have excellent electric characteristics and high stability.

Another embodiment of the present invention is a semiconductor device including a first buffer layer; an oxide semiconductor layer containing indium, titanium, and zinc, which is provided on and in contact with the first buffer layer; a second buffer layer provided on and in contact with the oxide semiconductor layer so as to cover a side surface of the first buffer layer and a side surface of the oxide semiconductor layer; a gate insulating film provided over the second buffer layer; a gate electrode layer overlapping with the oxide semiconductor layer with the gate insulating film positioned therebetween; an insulating film which is provided over the gate electrode layer and has openings; and a source electrode layer and a drain electrode layer provided over the insulating film and electrically connected to the oxide semiconductor layer through the openings. The first buffer layer and the second buffer layer each contain an oxide of one or more elements selected from titanium, aluminum, gallium, zirconium, hafnium, and a rare earth element.

In any of the above semiconductor devices, the oxide semiconductor layer preferably at least partly includes a region containing oxygen in excess of the stoichiometric ratio in a crystalline state.

The oxide semiconductor layer is preferably a crystalline semiconductor layer. In this specification and the like, the crystalline oxide semiconductor layer is an oxide semiconductor layer which includes crystals and which has crystallinity. The crystals in the crystalline oxide semiconductor layer may have crystal axes oriented in random directions or in a certain direction.

In one embodiment of the invention disclosed in this specification, a c-axis aligned crystalline oxide semiconductor (CAAC-OS) may be used as the crystalline oxide semiconductor layer.

The CAAC-OS is an oxide semiconductor including a crystal having a c-axis substantially perpendicular to the surface of the oxide semiconductor. Furthermore, the CAAC-OS has neither a single crystal structure nor an amorphous structure and is an oxide semiconductor including a crystal with c-axis alignment.

In each of the crystal regions included in the CAAC-OS, a c-axis is aligned in a direction parallel to a normal vector of a surface where the CAAC-OS is formed or a normal vector of a surface of the CAAC-OS, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal regions, the directions of the a-axis and the b-axis of one crystal region may be different from those of another crystal region. In this specification, a simple term "perpendicular" includes a range from 85° to 95°. In addition, a simple term "parallel" includes a range from −5° to 5°.

Since the c-axes of the crystal regions included in the CAAC-OS are aligned in the direction parallel to a normal vector of a surface where the CAAC-OS is formed or a normal vector of a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). Note that when the CAAC-OS is formed, the direction of c-axis of the crystal region is the direction parallel to a normal vector of the surface where the CAAC-OS is formed or a normal vector of the surface of the CAAC-OS.

The crystal region included in the CAAC-OS is formed by deposition or by performing treatment for crystallization such as heat treatment after deposition. An oxide semiconductor film which is deposited by using a sputtering target having crystallinity, such as a single crystal or polycrystalline sputtering target, has crystallinity, and particularly tends to be a CAAC-OS film. When ions collide with the surface of the sputtering target, the crystal region included in the sputtering target is cleaved along an a-b plane, and sputtered particles whose top and bottom surfaces are each aligned with a layer parallel to the a-b plane (flat-plate-like sputtered particle or pellet-like sputtered particle) are separated from the sputtering target. The flat-plate-like sputtered particles reach a substrate surface with their original crystal state maintained, whereby an oxide semiconductor film having a crystal region which is c-axis-aligned perpendicularly to the surface of the oxide semiconductor film can be easily obtained.

A film including the CAAC-OS is not a single crystal film, but this does not mean that the film including the CAAC-OS is composed of only an amorphous component. Although the film including the CAAC-OS includes a crystallized portion (crystalline portion), a boundary between one crystalline portion and another crystalline portion is not clear in some cases.

With the use of such a crystalline oxide semiconductor layer for a transistor, it is possible to provide a highly reliable semiconductor device in which changes of the electric characteristics of the transistor due to irradiation with visible light or ultraviolet light can be suppressed.

In any of the above semiconductor devices, a region in the oxide semiconductor layer, which does not overlap with the gate electrode layer, preferably contains a dopant. In such a structure, the oxide semiconductor layer has a channel formation region which overlaps with the gate electrode layer with the gate insulating film positioned therebetween, and a pair of low-resistance regions between which the channel formation region is sandwiched in the channel length direction.

With the oxide semiconductor layer including the low-resistance regions between which the channel formation region is sandwiched in the channel length direction, on-state characteristics (e.g., on-state current and field-effect mobility) of the transistor are improved, which enables high-speed operation and high-speed response of the transistor. Further, the low-resistance regions are formed in a self-aligned manner and do not overlap with the gate electrode layer; thus, parasitic capacitance can be reduced. A reduction in parasitic capacitance leads to lowering of power consumption of the whole semiconductor device.

The concentration of the dopant in the low-resistance regions is preferably higher than or equal to $5 \times 10^{18}/cm^3$ and lower than or equal to $1 \times 10^{22}/cm^3$.

According to one embodiment of the present invention, a semiconductor device which includes an oxide semiconductor containing a conductive metal oxide and has excellent electric characteristics and high reliability, and a method for manufacturing the semiconductor device can be provided.

BRIEF DESCRIPTION OF THE DRAWINGS

FIGS. 10A and 10B each illustrate one embodiment of a semiconductor device.

DETAILED DESCRIPTION OF THE INVENTION

Figure 1A:
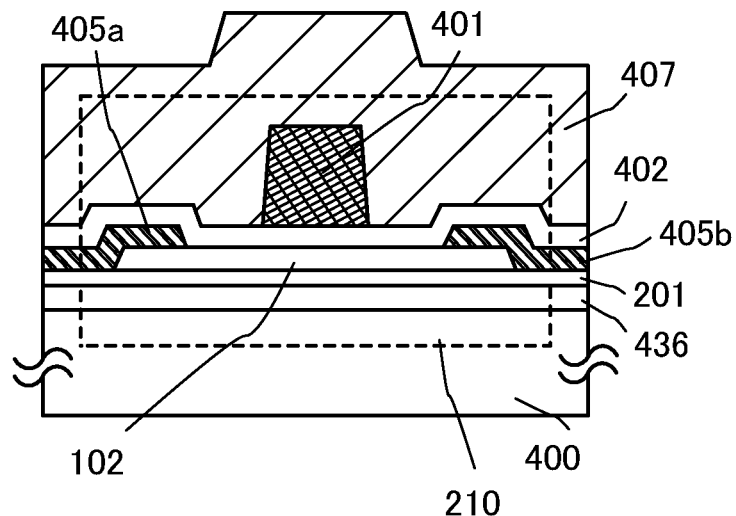
FIGS. 1A and 1B are cross-sectional views each illustrating one embodiment of a semiconductor device.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention should not be limited to the descriptions of the embodiments below.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, embodiments of the present invention are not limited to such scales.

Embodiment 1

In this embodiment, one embodiment of a semiconductor device will be described with reference to FIGS. 1A and 1B.

Figure 1B:
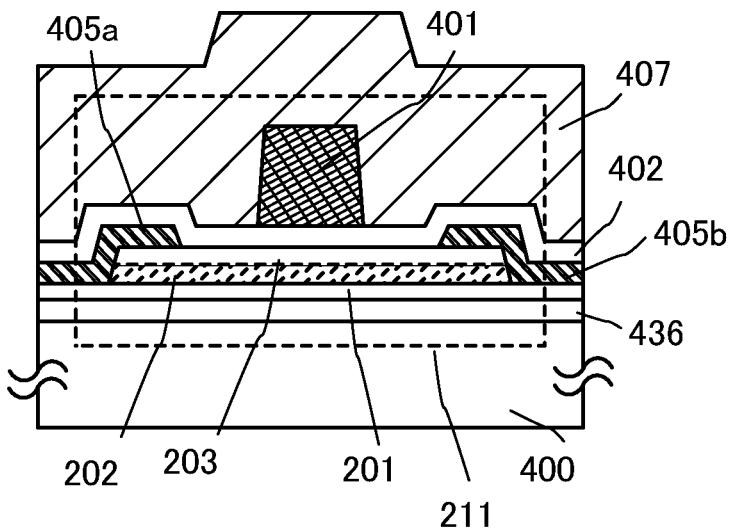

A transistor 210 in FIG. 1A and a transistor 211 in FIG. 1B are examples of planar type transistors having a top-gate structure.

The transistor 210 illustrated in FIG. 1A includes, over a substrate 400 having an insulating surface on which a stack of an oxide insulating film 436 and a titanium oxide film 201 is provided, an oxide semiconductor layer 102 containing indium, titanium, and zinc, a source electrode layer 405a, a drain electrode layer 405b, a gate insulating film 402, and a gate electrode layer 401. An insulating film 407 is formed over the transistor 210.

The oxide insulating film 436 can be formed using silicon oxide, silicon oxynitride, or silicon nitride oxide by a plasma CVD method, a sputtering method, or the like. The oxide insulating film 436 may have either a single-layer structure or a stacked-layer structure.

The titanium oxide film 201 can be formed by a sputtering method using a target including titanium oxide. The titanium oxide film 201 and the oxide semiconductor layer 102 contain the same element, titanium; thus, the interface between the titanium oxide film 201 and the oxide semiconductor layer 102 can be favorable. Thus, charge or the like generated due to the operation of a semiconductor device can be prevented from being trapped at the interface between the oxide semiconductor layer and the titanium oxide film 201. With such a structure, the oxide semiconductor layer can be less adversely affected by charge, which suppresses shift of the threshold value of the transistor due to trapping of charge at the interface of the oxide semiconductor layer.

In the case where the oxide semiconductor layer 102 is a crystalline oxide semiconductor layer, the titanium oxide film 201 containing a constituent similar to that of the oxide semiconductor layer, which is provided in contact with the oxide semiconductor layer, enables the crystallinity in the vicinity of the interface between the oxide semiconductor layer and the titanium oxide film 201 to be improved. Therefore, crystalline regions can be formed at the interface between the oxide semiconductor layer and the titanium oxide film 201 which are in contact with each other and in the bulk, and thus the level in a band of the crystalline oxide semiconductor layer can be reduced. Consequently, the transistor characteristics (e.g., field-effect mobility) can be improved.

The transistor 211 illustrated in FIG. 1B includes, over the substrate 400 having an insulating surface on which a stack of the oxide insulating film 436 and the titanium oxide film 201 is provided, an oxide semiconductor stack of a first oxide semiconductor layer 202 and a second oxide semiconductor layer 203 formed using different materials, the source electrode layer 405a, the drain electrode layer 405b, the gate insulating film 402, and the gate electrode layer 401. The insulating film 407 is formed over the transistor 211.

Note that in FIG. 1B, an interface between the first oxide semiconductor layer 202 and the second oxide semiconductor layer 203 is shown with a dotted line, by which the oxide semiconductor stack is illustrated schematically. The interface between the first oxide semiconductor layer 202 and the second oxide semiconductor layer 203 is not clear in some cases depending on a material, film formation conditions, and/or heat treatment. In the case where the interface is not clear, a portion which can be called mixed region or mixed layer including a plurality of oxide semiconductor layers which are different from each other may be formed. The same applies to the other drawings of this specification.

In this embodiment, an In—Ti—Zn—O film is used as the first oxide semiconductor layer 202, and an In—Ga—Zn—O film is used as the second oxide semiconductor layer 203. The titanium oxide film 201, the first oxide semiconductor layer 202, and the second oxide semiconductor layer 203 can be formed in succession without exposure to the air by using a sputtering method. By successive formation without exposure to the air, the interface between the titanium oxide film 201 and the first oxide semiconductor layer 202 and the interface between the first oxide semiconductor layer 202 and the second oxide semiconductor layer 203 can be made favorable.

Although an In—Ga—Zn—O film is used as the second oxide semiconductor layer 203 in this embodiment, it is possible to use another oxide semiconductor. For example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as the oxide semiconductor.

The titanium oxide film 201 is provided between the oxide insulating film 436 and the oxide semiconductor layer 102 in this embodiment, but is not necessarily provided unless needed. Instead of the titanium oxide film, an aluminum oxide film, a gallium oxide film, a zirconium oxide film, a hafnium oxide film, or the like may be provided between the oxide insulating film 436 and the oxide semiconductor layer 102.

In this embodiment, the transistors have a single-gate structure in which one channel formation region is formed, but there is no particular limitation. For example, the transistors may have a double-gate structure in which two channel formation regions are formed, or a triple-gate structure in which three channel formation regions are formed. Alternatively, the transistors may have a dual-gate structure including two gate electrode layers positioned over and below a channel formation region with a gate insulating film provided therebetween.

The transistors described in this embodiment can be applied to semiconductor devices having a variety of functions, such as a power device which is mounted on a power supply circuit and a semiconductor integrated circuit like LSI.

Embodiment 2

In this embodiment, one embodiment of a semiconductor device will be described with reference to FIGS. 2A to 2C.

Figure 2A:
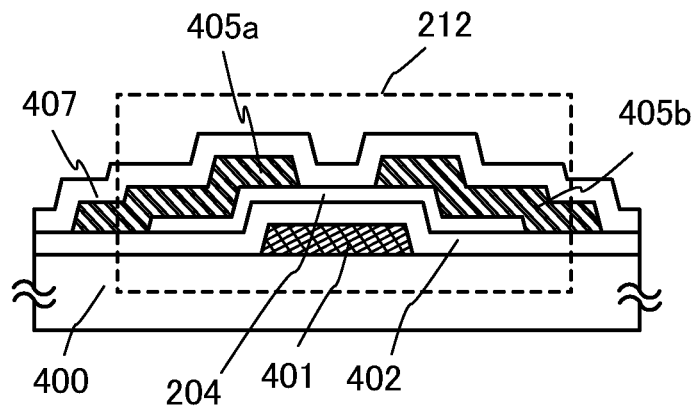
FIGS. 2A to 2C are cross-sectional views each illustrating one embodiment of a semiconductor device.
Figure 2B:
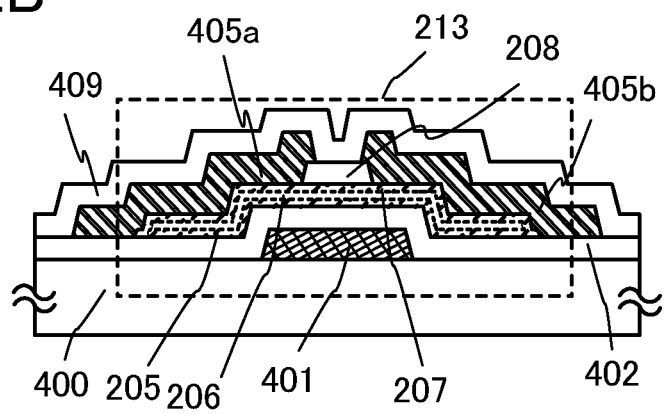
Figure 2C:
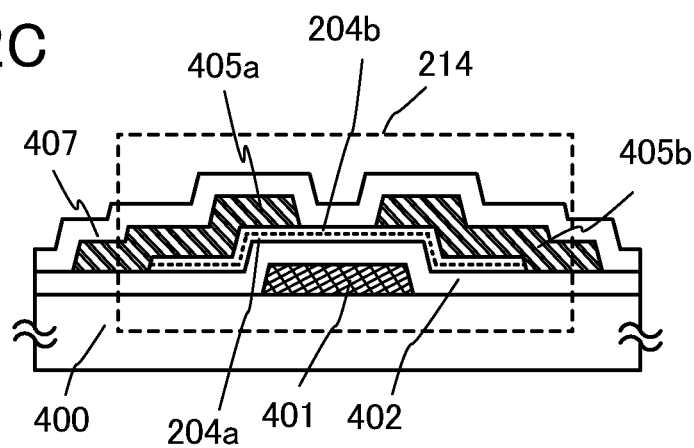

A transistor 212 shown in FIG. 2A, a transistor 213 shown in FIG. 2B, and a transistor 214 shown in FIG. 2C are examples of inverted staggered transistors having a bottom-gate structure.

The transistor 212 illustrated in FIG. 2A includes the gate electrode layer 401, the gate insulating film 402, an oxide semiconductor layer 204 containing indium titanium, and zinc, the source electrode layer 405a, and the drain electrode layer 405b provided in this order over the substrate 400 having an insulating surface. The insulating film 407 is formed over the transistor 212.

When the source electrode layer 405a and the drain electrode layer 405b each have a three-layer structure in which a titanium film, an aluminum film, and a titanium film are stacked, the interface between the oxide semiconductor layer 204 and the source electrode layer 405a and the interface between the oxide semiconductor layer 204 and the drain electrode layer 405b can be favorable, because the oxide semiconductor layer 204 contains titanium.

Alternatively, titanium oxide films may be provided between the source electrode layer 405a and the oxide semiconductor layer 204 and between the drain electrode layer 405b and the oxide semiconductor layer 204.

Further, the transistor 213 which has a bottom-gate structure of a channel-protective type is shown in FIG. 2B as another embodiment of a semiconductor device.

As illustrated in FIG. 2B, which is a cross-sectional view in the channel length direction, the transistor 213 includes the gate electrode layer 401, the gate insulating film 402, an oxide semiconductor stack including a first oxide semiconductor layer 205, a second oxide semiconductor layer 206, and a third oxide semiconductor layer 207, an insulating film 208 functioning as a channel protective film, the source electrode layer 405a, and the drain electrode layer 405b, which are provided in this order over the substrate 400 having an insulating surface. An insulating film 409 is formed over the transistor 213.

The first oxide semiconductor layer 205 is provided on and in contact with the gate insulating film 402. The second oxide semiconductor layer 206 is stacked over the first oxide semiconductor layer 205. The third oxide semiconductor layer 207 covers a side surface of the first oxide semiconductor layer 205 and top and side surfaces of the second oxide semiconductor layer 206, and the edge portion of the third oxide semiconductor layer 207 is in contact with the gate insulating film 402. The structure in which each of the first oxide semiconductor layer 205 and the second oxide semiconductor layer 206 is in contact with neither the source electrode layer 405a nor the drain electrode layer 405b leads to suppression of generation of leakage current (parasitic channel) between the source electrode layer 405a and the drain electrode layer 405b of the transistor 213.

In this embodiment, an In—Ga—Zn—O film is used as each of the first oxide semiconductor layer 205 and the third oxide semiconductor layer 207, and an In—Ti—Zn—O film is used as the second oxide semiconductor layer 206. Note that there is no particular limitation on the materials of the first oxide semiconductor layer 205, the second oxide semiconductor layer 206, and the third oxide semiconductor layer 207, as long as at least one of these layers contains indium, titanium, and zinc.

Although three oxide semiconductor layers are stacked in FIG. 2B, a stack of two oxide semiconductor layers may be used as in FIG. 2C, which shows an example in which a second oxide semiconductor layer 204b is stacked over a first oxide semiconductor layer 204a. The structure in FIG. 2C is the same as that in FIG. 2A, except that the oxide semiconductor layer is a stacked layer. In the transistor 214 in FIG. 2C, an In—Ti—Zn—O film is used as the first oxide semiconductor layer 204a, and an In—Ga—Zn—O film is used as the second oxide semiconductor layer 204b. It is also possible to use a stack of four or more oxide semiconductor layers.

Since the transistors 212 and 213 have a bottom-gate structure, they can be suitably used as switching elements of an active matrix display device.

This embodiment can be implemented in appropriate combination with any of the other embodiments.

Embodiment 3

In this embodiment, one embodiment of a semiconductor device and a method for manufacturing the semiconductor device will be described with reference to FIGS. 3A to 3C, FIGS. 4A to 4E, and FIGS. 5A and 5B. In this embodiment, a transistor including an oxide semiconductor layer will be described as an example of the semiconductor device.

Figure 3A:
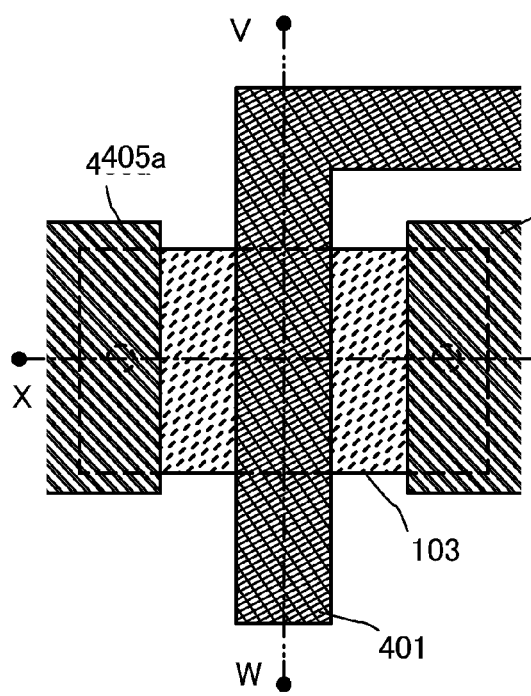
FIGS. 3A to 3C are a plan view and cross-sectional views illustrating one embodiment of a semiconductor device.
Figure 3C:
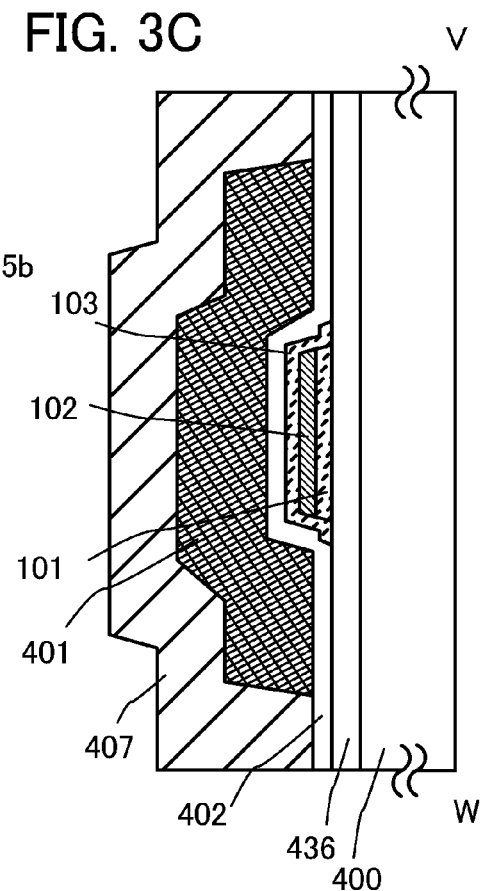
Figure 3B:
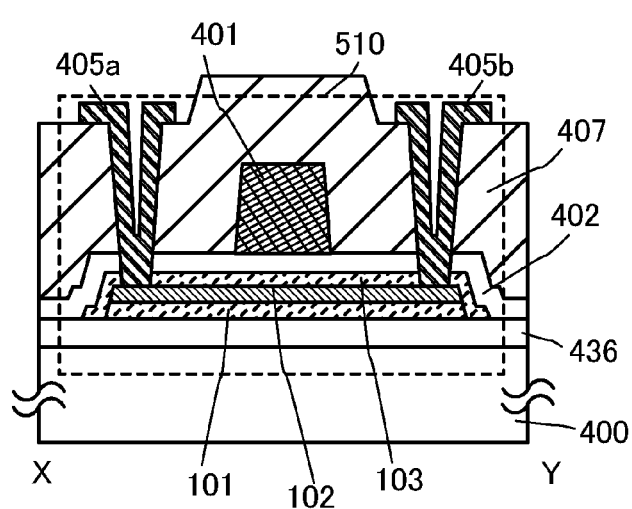

A transistor 510 illustrated in FIG. 3A, FIG. 3B, and FIG. 3C is an example of a top-gate transistor. FIG. 3A is a plan view, FIG. 3B is a cross-sectional view taken along chain line X-Y in FIG. 3A, and FIG. 3C is a cross-sectional view taken along chain line V-W in FIG. 3A.

As illustrated in FIG. 3B, which is a cross-sectional view in the channel length direction, the transistor 510 includes a first buffer layer 101, the oxide semiconductor layer 102, a second buffer layer 103, the gate insulating film 402, the gate electrode layer 401, the insulating film 407, the source electrode layer 405a, and the drain electrode layer 405b over the substrate 400 having an insulating surface on which the oxide insulating film 436 is provided.

In the transistor 510, the first buffer layer 101 is formed on and in contact with the oxide insulating film 436, and the oxide semiconductor layer 102 is formed over the first buffer layer 101. The second buffer layer 103 is formed over the oxide semiconductor layer 102 so as to cover a side surface of the first buffer layer 101 and a side surface of the oxide semiconductor layer 102. The edge portion of the second buffer layer 103 is in contact with the oxide insulating film 436.

Since the first buffer layer 101 and the second buffer layer 103 are in contact with the oxide semiconductor layer 102, they preferably include an oxide containing a constituent similar to that of the oxide semiconductor layer 102. Specifically, the first buffer layer 101 and the second buffer layer 103 preferably include an oxide of one or more elements selected from a constituent element of the oxide semiconductor layer 102 such as titanium (Ti), aluminum (Al), gallium (Ga), zirconium (Zr), or hafnium (Hf), a Group 13 element including aluminum and gallium, a Group 4 element including titanium and zirconium, and a Group 3 element including a rare earth element. Among oxides of these elements, an oxide of any of aluminum, gallium, and a rare earth element, which belong to Group 3 or Group 13, is more preferably used. As the rare earth element, scandium (Sc), yttrium (Y), cerium (Ce), samarium (Sm), or gadolinium (Gd) is preferably used. Such a material is compatible with the oxide semiconductor layer 102, and the use of such a material for the first buffer layer 101 and the second buffer layer 103 enables a state of the interface between the oxide semiconductor layer 102 and each of these layers to be favorable. Further, the crystallinity of the oxide semiconductor layer 102 can be improved.

FIG. 3C is a cross-sectional view in the channel width direction. As in FIG. 3B, in a cross section in the channel width direction of the transistor 510, a side surface of the oxide semiconductor layer 102 is covered with an end portion of the second buffer layer 103. With such a structure, generation of a parasitic channel between the oxide semiconductor layer 102 and the gate electrode layer 401 can be prevented.

FIGS. 4A to 4E illustrate an example of a method for manufacturing the transistor 510.

Figure 4A:
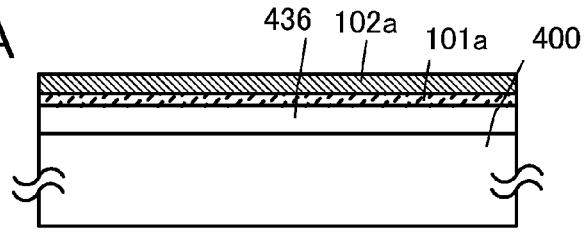
FIGS. 4A to 4E illustrate an example of a manufacturing process of a semiconductor device.

First, the oxide insulating film 436, a first buffer film 101a which is to be the first buffer layer 101, and an oxide semiconductor film 102a which is to be the oxide semiconductor layer 102 are formed in this order over the substrate 400 having an insulating surface (see FIG. 4A).

There is no particular limitation on a substrate that can be used as the substrate 400 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. In order to manufacture a flexible semiconductor device, the transistor including the oxide semiconductor layer may be directly formed over a flexible substrate. Alternatively, the transistor including the oxide semiconductor layer may be formed over a manufacturing substrate, and then, the transistor may be separated and transferred to a flexible substrate. Note that in order to separate the transistor from the manufacturing substrate and transfer it to the flexible substrate, a separation layer may be provided between the manufacturing substrate and the transistor including the oxide semiconductor layer.

The oxide insulating film 436 can be formed using silicon oxide, silicon oxynitride, or silicon nitride oxide by a plasma CVD method, a sputtering method, or the like. The oxide insulating film 436 may have either a single-layer structure or a stacked-layer structure. A silicon oxide film formed by a sputtering method is used as the oxide insulating film 436 in this embodiment.

As the first buffer film 101a, a film containing an oxide of one or more elements selected from titanium, aluminum, gallium, zirconium, hafnium, and a rare earth element is formed. Such a material is compatible with the oxide semiconductor layer 102 to be formed later, and therefore, the use of such a material for a layer in contact with the oxide semiconductor layer 102 enables a state of the interface with the oxide semiconductor layer 102 to be kept favorable. Further, the use of such a material for the first buffer layer 101 enables the crystallinity of the oxide semiconductor layer 102 to be improved.

There is no particular limitation on the method for forming the first buffer film 101a, and for example, the first buffer film 101a may be formed by a deposition method such as a plasma CVD method or a sputtering method.

The oxide semiconductor film formed over the first buffer film 101a may have either a single-layer structure or a stacked-layer structure. Further, the oxide semiconductor film may either have an amorphous structure or be a crystalline oxide semiconductor. In the case where the oxide semiconductor film 102a has an amorphous structure, heat treatment may be performed on the oxide semiconductor layer in a later manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., further preferably higher than or equal to 500° C., still further preferably higher than or equal to 550° C. Note that this heat treatment may double as another heat treatment in the manufacturing process.

The oxide semiconductor film 102a can be formed by a sputtering method, a molecular beam epitaxy (MBE) method, a CVD method, a pulse laser deposition method, an atomic layer deposition (ALD) method, or the like as appropriate. The oxide semiconductor film 102a may be formed using a sputtering apparatus which performs film formation with surfaces of a plurality of substrates set substantially perpendicular to a surface of a sputtering target.

In the formation of the oxide semiconductor film 102a, the hydrogen concentration in the oxide semiconductor film 102a is preferably reduced as much as possible. In order to reduce the hydrogen concentration, for example, in the case where the oxide semiconductor film 102a is formed by a sputtering method, oxygen, a high-purity rare gas (typically, argon) from which impurities such as hydrogen, water, a hydroxyl group, and hydride have been removed, or a mixed gas of oxygen and the rare gas is used as appropriate as a sputtering gas supplied to a deposition chamber of a sputtering apparatus.

The oxide semiconductor layer is formed in such a manner that a sputtering gas from which hydrogen and moisture have been removed is introduced into the deposition chamber while moisture remaining therein is removed, whereby the hydrogen concentration in the formed oxide semiconductor layer can be reduced. In order to remove moisture remaining in the deposition chamber, an entrapment vacuum pump such as a cryopump, an ion pump, or a titanium sublimation pump is preferably used. As an evacuation unit, a turbo molecular pump provided with a cold trap may be used. In the deposition chamber which is evacuated with the cryopump, for example, a hydrogen atom, a compound containing a hydrogen atom, such as water ($H_2O$), (further preferably, also a compound containing a carbon atom), and the like are removed, whereby the impurity concentration in the oxide semiconductor film 102a formed in the deposition chamber can be reduced.

The oxide insulating film 436, the first buffer film 101a, and the oxide semiconductor film 102a are preferably formed in succession without exposure to the air. By successive formation of the oxide insulating film 436, the first buffer film 101a, and the oxide semiconductor film 102a without exposure to the air, impurities such as hydrogen and moisture can be prevented from being adsorbed onto the interface between the oxide insulating film 436 and the first buffer film 101a and the interface between the first buffer film 101a and the oxide semiconductor film 102a.

In order to reduce the impurity concentration in the oxide semiconductor film 102a, it is also effective to form the oxide semiconductor film 102a while the substrate 400 is kept at high temperature. The temperature at which the substrate 400 is heated may be higher than or equal to 150° C. and lower than or equal to 450° C.; the substrate temperature is preferably higher than or equal to 200° C. and lower than or equal to 350° C. By heating the substrate at high temperature during the film formation, a crystalline oxide semiconductor film can be formed.

An oxide semiconductor used for the oxide semiconductor film 102a preferably contains at least indium (In), titanium (Ti), and zinc (Zn). As a stabilizer for reducing variation in electric characteristics of a transistor including the oxide semiconductor, gallium (Ga) may be additionally contained. Tin (Sn) may be contained as a stabilizer. Hafnium (Hf) may be contained as a stabilizer. Aluminum (Al) may be contained as a stabilizer. Zirconium (Zr) may be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, in the case of forming the oxide semiconductor film 102a by a sputtering method using a direct-current (DC) power source or an alternating-current (AC) power source, a target in which the atomic ratio of metal elements is In:Ti:Zn=1:1:1 is used. Alternatively, a target in which the atomic ratio of metal elements is In:Ti:Zn=2:1:3 or In:Ti:Zn=3:1:2 can be used.

Note that it is preferable that the oxide semiconductor film 102a be formed under a condition that much oxygen is contained during film formation (e.g., formed by a sputtering method in a 100% oxygen atmosphere), so as to be a film containing much oxygen (preferably having a region containing oxygen in excess of the stoichiometric ratio in the oxide semiconductor in a crystalline state).

It is preferable that a high-purity gas from which impurities such as hydrogen, water, a hydroxyl group, and hydride have been removed be used as a sputtering gas used for the formation of the oxide semiconductor film 102a.

In this embodiment, the oxide semiconductor film 102a is formed at a film formation temperature higher than or equal to 200° C. and lower than or equal to 450° C. in a rare gas (typically, argon) atmosphere, an oxygen atmosphere, or a mixed atmosphere of a rare gas and oxygen; in such a manner, the crystalline oxide semiconductor film of an oxide semiconductor having a crystalline region is formed.

For example, as the oxide semiconductor having a crystalline region, an oxide semiconductor including a crystal having a c-axis substantially perpendicular to a surface of the oxide semiconductor (CAAC-OS) can be used. There are three methods for obtaining a crystalline oxide semiconductor having c-axis alignment. The first method is to form an oxide semiconductor film at a film formation temperature higher than or equal to 200° C. and lower than or equal to 450° C., thereby obtaining c-axis alignment substantially perpendicular to a surface. The second method is to form a thin oxide semiconductor film and then subject the film to heat treatment performed at a temperature higher than or equal to 200° C. and lower than or equal to 700° C., thereby obtaining c-axis alignment substantially perpendicular to a surface. The third method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

In a crystalline oxide semiconductor, defects in a bulk can be further reduced, and when a surface flatness is improved, mobility higher than that of an oxide semiconductor in an amorphous state can be obtained. In order to improve the surface flatness, the oxide semiconductor is preferably formed on a flat surface. Specifically, the oxide semiconductor may be formed on a surface with an average surface roughness ($R_a$) of 1 nm or less, preferably 0.3 nm or less, more preferably 0.1 nm or less.

Note that $R_a$ is obtained by expanding arithmetic mean surface roughness, which is defined by JIS B 0601: 2001 (ISO4287: 1997), into three dimensions so as to be applied to a curved surface. $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Moreover, $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

Thus, planarization treatment may be performed on a region of the first buffer film 101a which is in contact with the oxide semiconductor film 102a. The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the first buffer film 101a.

In this embodiment, the oxide semiconductor film 102a is formed over the first buffer film 101a which is an oxide film containing a constituent similar to that of the oxide semiconductor film 102a. Therefore, the state of the interface between these two layers can be made favorable, and the crystallinity in the vicinity of the interface can be improved.

Next, the first buffer film 101a and the oxide semiconductor film 102a are processed into island shapes by a photolithography step, so that the first buffer layer 101 and the oxide semiconductor layer 102 are formed.

A resist mask used for forming the first buffer layer 101 and the oxide semiconductor layer 102 may be formed by an inkjet method. Formation of the resist mask by an inkjet method needs no photomask; thus, manufacturing cost can be reduced.

Note that etching of the first buffer film 101a and the oxide semiconductor film 102a may be dry etching, wet etching, or both dry etching and wet etching.

In this embodiment, the first buffer film 101a and the oxide semiconductor film 102a are processed by etching with the use of the same mask, so that end portions of the side surfaces of the first buffer layer 101 and the oxide semiconductor layer 102 formed through the processing are aligned and the first buffer layer 101 and the oxide semiconductor layer 102 have the same shape.

Further, the oxide semiconductor layer 102 is preferably subjected to heat treatment for removing excess hydrogen (including water and a hydroxyl group) in the oxide semiconductor layer 102 (dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an n-type impurity, can be removed from the oxide semiconductor by the heat treatment. For example, the hydrogen concentration in the oxide semiconductor layer 102 after the dehydration or dehydrogenation treatment can be $5 \times 10^{19}/cm^3$ or lower, preferably $5 \times 10^{18}/cm^3$ or lower.

Note that the heat treatment for the dehydration or dehydrogenation may be performed at any timing in the process of manufacturing the transistor 510 as long as it is performed between the formation of the oxide semiconductor film 102a and formation of the insulating film 407 which is to be formed later. In the case where an aluminum oxide film is formed as the second buffer layer 103, the heat treatment is preferably performed before the second buffer layer 103 is formed. The heat treatment for the dehydration or dehydrogenation may be performed plural times, and may double as another heat treatment.

The heat treatment for the dehydration or dehydrogenation is preferably performed before the oxide semiconductor film 102a is processed into an island shape because oxygen contained in the oxide insulating film 436 can be prevented from being released by the heat treatment.

Note that in the heat treatment, it is preferable that water, hydrogen, and the like be not contained in nitrogen or a rare gas such as helium, neon, or argon. The purity of nitrogen or a rare gas such as helium, neon, or argon which is introduced into a heat treatment apparatus is preferably 6N (99.9999%) or higher, more preferably 7N (99.99999%) or higher (that is, the impurity concentration is preferably 1 ppm or lower, more preferably 0.1 ppm or lower).

In addition, after the oxide semiconductor layer 102 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, or the like be not contained in the oxygen gas or the $N_2O$ gas. The purity of the oxygen gas or the $N_2O$ gas which is introduced into the heat treatment apparatus is preferably 6N or higher, more preferably 7N or higher (i.e., the impurity concentration in the oxygen gas or the $N_2O$ gas is preferably 1 ppm or lower, more preferably 0.1 ppm or lower). The oxygen gas or the $N_2O$ gas acts to supply oxygen that is a main component material of the oxide semiconductor and that has been reduced through the step of removing an impurity for dehydration or dehydrogenation, so that the oxide semiconductor layer 102 can have high purity and be an electrically i-type (intrinsic) oxide semiconductor layer.

Through this heat treatment, the first buffer layer 101 containing a constituent similar to that of the oxide semiconductor layer 102 can also be highly purified. Further, the crystallinity of the oxide semiconductor layer 102 (in a bulk and the vicinity of the interface with the first buffer layer 101) can also be improved.

Figure 4B:
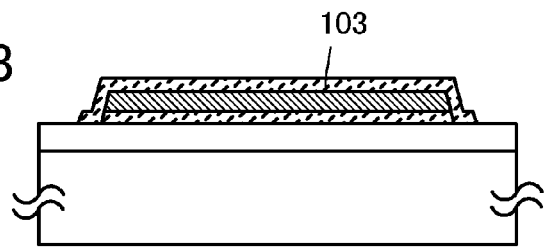

Next, the second buffer layer 103 is formed to cover the island-shaped first buffer layer 101 and the island-shaped oxide semiconductor layer 102 (see FIG. 4B). The deposition conditions of the second buffer layer 103 are the same as those of the first buffer layer 101; thus description thereof is omitted here. Note that by a second photolithography step, the second buffer layer 103 which overlaps with the oxide semiconductor layer 102 and has a top surface shape larger than a plan area of the oxide semiconductor layer 102 is formed. Since the second buffer layer 103 is an oxide film containing a constituent similar to that of the oxide semiconductor layer 102, the state of the interface between these two layers can be made favorable. Further, the crystallinity in the vicinity of the interface between the oxide semiconductor layer 102 and the second buffer layer 103 can be improved.

Figure 4C:
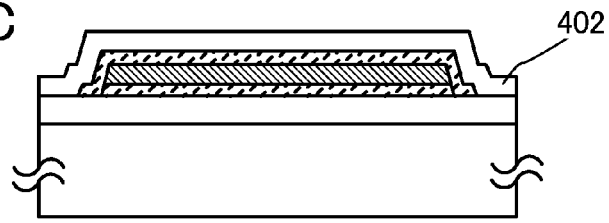

Next, the gate insulating film 402 is formed to cover the second buffer layer 103 (see FIG. 4C).

The gate insulating film 402 can be formed with a thickness greater than or equal to 1 nm and less than or equal to 20 nm by a sputtering method, an MBE method, a CVD method, a pulsed laser deposition method, an ALD method, or the like as appropriate. The gate insulating film 402 may be formed using a sputtering apparatus which performs film formation with surfaces of a plurality of substrates set substantially perpendicular to a surface of a sputtering target.

The gate insulating film 402 can be formed using a silicon oxide film, a silicon nitride film, a silicon oxynitride film, or a silicon nitride oxide film. The gate insulating film 402 may have either a single-layer structure or a stacked-layer structure.

Figure 4D:
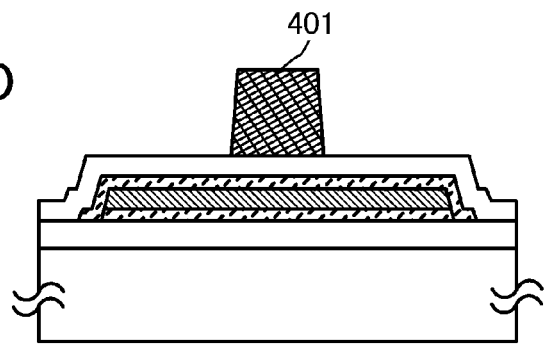

Next, the gate electrode layer 401 is formed over the gate insulating film 402 by a plasma CVD method, a sputtering method, or the like (see FIG. 4D).

The gate electrode layer 401 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have either a single-layer structure or a stacked-layer structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Alternatively, the gate electrode layer 401 may have a stacked-layer structure of the above conductive material and the above metal material.

As one layer of the gate electrode layer 401 which is in contact with the gate insulating film 402, a metal oxide containing nitrogen, specifically, an In—Ga—Zn-based oxide film containing nitrogen, an In—Sn-based oxide film containing nitrogen, an In—Ga-based oxide film containing nitrogen, an InZn-based oxide film containing nitrogen, a Sn-based oxide film containing nitrogen, an In-based oxide film containing nitrogen, or a metal nitride (e.g., InN or SnN) film can be used. Such a film has a work function of 5 eV or higher, preferably 5.5 eV or higher, and use of this film as the gate electrode layer enables the threshold voltage of electric characteristics of a transistor to be a positive value. Accordingly, a so-called normally-off switching element can be obtained.

Next, the insulating film 407 is formed over the gate insulating film 402 and the gate electrode layer 401.

The insulating film 407 can be formed using a material similar to that of the gate insulating film 402.

As the insulating film 407, a planarization insulating film may be used. For the planarization insulating film, an organic material such as polyimide, acrylic, or benzocyclobutene can be used. Other than such organic materials, it is also possible to use a low-dielectric constant material (low-k material) or the like. Note that the planarization insulating film may be formed by stacking a plurality of insulating films formed using any of these materials.

Figure 4E:
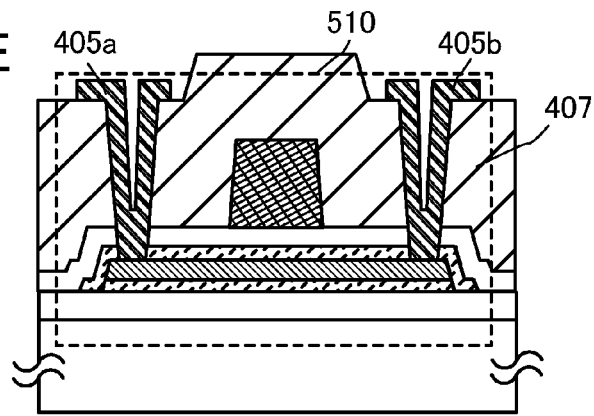

Next, contact holes (openings) reaching the oxide semiconductor layer 102 are formed in the insulating film 407, and the source electrode layer 405*a* and the drain electrode layer 405*b* electrically connected to the oxide semiconductor layer 102 are formed in the respective contact holes (see FIG. 4E).

As a conductive film used for forming the source electrode layer and the drain electrode layer, it is possible to use, for example, a metal film containing an element selected from Al, Cr, Cu, Ta, Ti, Mo, and W, a metal nitride film containing any of these elements as its component (a titanium nitride film, a molybdenum nitride film, or a tungsten nitride film), or the like. Alternatively, a film of a high-melting-point metal such as Ti, Mo, or W or a metal nitride film thereof (a titanium nitride film, a molybdenum nitride film, or a tungsten nitride film) may be formed over or/and below a metal film such as an Al film or a Cu film. Further, a dopant such as phosphorus or boron may be added to the conductive film used for forming the source electrode layer 405*a* and the drain electrode layer 405*b*.

Through the above steps, the transistor 510 can be formed.

FIGS. 5A and 5B and FIGS. 6A to 6C illustrate structures of a transistor according to this embodiment, which are different from that of the transistor 510. The transistors illustrated in FIGS. 5A and 5B and FIGS. 6A to 6C are just partly different from the transistor 510 described above; thus, the same reference numerals are used to denote the same portions for simplification, and detailed description of the same portion is omitted in this embodiment.

Figure 5A:
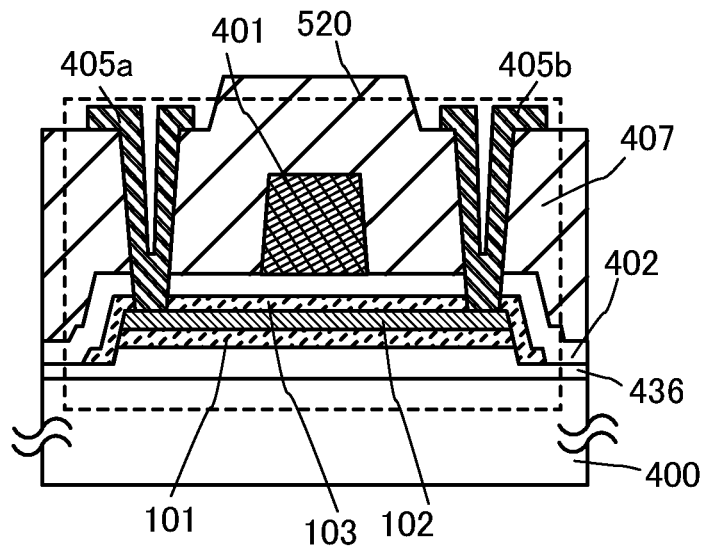
FIGS. 5A and 5B are cross-sectional views each illustrating one embodiment of a semiconductor device.

A transistor 520 illustrated in FIG. 5A has a structure in which part of the oxide insulating film 436 is etched to be thin with the use of a mask which is used for processing the first buffer film 101*a* and the oxide semiconductor film 102*a* into island shapes (or with the use of the island-shaped first buffer layer 101 and oxide semiconductor layer 102 which are manufactured by the processing, as a mask). In the transistor 520, a region of the oxide insulating film 436 which overlaps with the island-shaped first buffer layer 101 and oxide semiconductor layer 102 has a larger thickness than the other regions of the oxide insulating film 436 (which do not overlap with the island-shaped first buffer layer 101 and oxide semiconductor layer 102). By etching part of the oxide insulating film 436 at the time of processing for forming the island-shaped first buffer layer 101 and oxide semiconductor layer 102, an etching residue of the oxide semiconductor layer 102 or the like is removed, and thus generation of leakage current can be prevented.

Figure 5B:
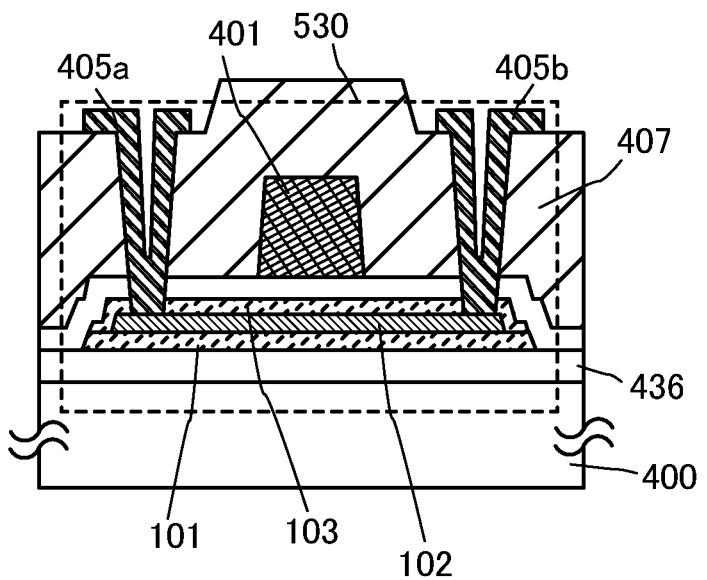

A transistor 530 illustrated in FIG. 5B has a structure in which the first buffer layer 101, the oxide semiconductor layer 102, and the second buffer layer 103 are formed so as to have island shapes through three photolithography steps. The island-shaped first buffer layer 101, oxide semiconductor layer 102, and second buffer layer 103 in the transistor 530 are formed in the following manner: after the first buffer film 101*a* is formed, the island-shaped first buffer layer 101 is formed with the use of a first mask; after the oxide semiconductor film 102*a* is formed over the island-shaped first buffer layer 101, the island-shaped oxide semiconductor layer 102 is formed with the use of a second mask; and after a second buffer film 103*a* which is to be the second buffer layer 103 is formed over the island-shaped first buffer layer 101 and oxide semiconductor layer 102, the second buffer film 103*a* is processed into an island shape with the use of a third mask.

In the transistor 530, a side surface of the first buffer layer 101 extends beyond a side surface of the oxide semiconductor layer 102, and the second buffer layer 103 is in contact with part of a top surface of the first buffer layer 101. An end portion of the second buffer layer 103 is in contact with and overlaps with an end portion of the first buffer layer 101.

Figure 6A:
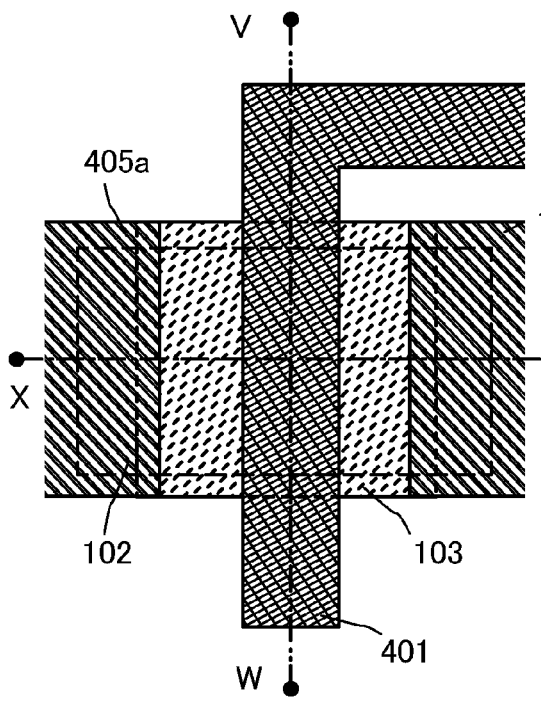
FIGS. 6A to 6C are a plan view and cross-sectional views illustrating one embodiment of a semiconductor device.
Figure 6C:
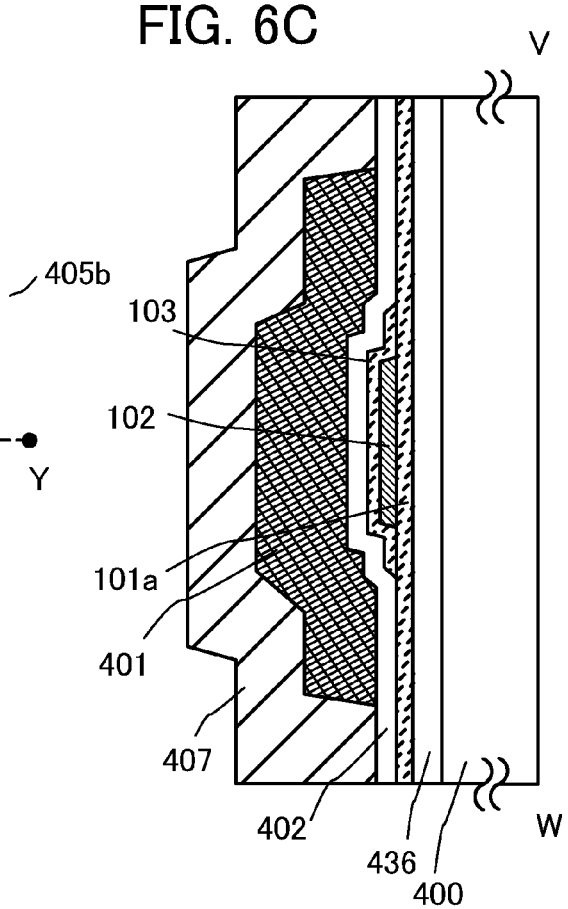
Figure 6B:
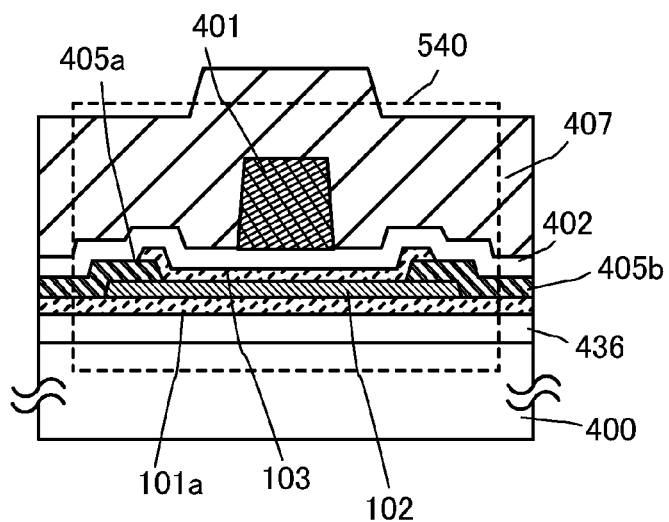

FIGS. 6A to 6C illustrate a structure of a transistor 540. FIG. 6A is a plan view, FIG. 6B is a cross-sectional view taken along chain line X-Y in FIG. 6A, and FIG. 6C is a cross-sectional view taken along chain line V-W in FIG. 6A.

As illustrated in the cross-sectional view in the channel length direction in FIG. 6B, the transistor 540 includes the first buffer film 101*a*, the island-shaped oxide semiconductor layer 102 provided over the first buffer film 101*a*, the source electrode layer 405*a* and the drain electrode layer 405*b* provided on and in contact with the oxide semiconductor layer 102, the second buffer layer 103 provided over the source electrode layer 405*a* and the drain electrode layer 405*b* and in contact with at least a channel formation region of the oxide semiconductor layer 102, the gate insulating film 402, and the gate electrode layer 401. In the transistor 540, the insulating film 407 may be provided over the gate electrode layer 401.

As illustrated in the cross-sectional view in the channel width direction in FIG. 6C, in a cross section in the channel width direction of the transistor 540, a side surface of the oxide semiconductor layer 102 is covered with an end portion of the second buffer layer 103. With such a structure, generation of a parasitic channel between the oxide semiconductor layer 102 and the gate electrode layer 401 can be prevented.

In the transistor 540 illustrated in FIGS. 6B and 6C, the second buffer layer 103 is provided so as to cover the source electrode layer 405*a* and the drain electrode layer 405*b*, and to be in contact with the first buffer film 101*a* and the oxide semiconductor layer 102. That is, the oxide semiconductor layer 102 is surrounded by the first buffer film 101*a* and the second buffer layer 103. Even being formed all over the substrate, the first buffer film 101*a* can be used in a display device when having a sufficient light-transmitting property. For example, it is possible to manufacture a transmissive liquid crystal display device by using a titanium oxide film as the first buffer film 101a. In the case where a titanium oxide film is used as the first buffer film 101a, the first buffer film 101a can also function as a film for preventing electrification. As in the transistor 510 or the like, the first buffer layer 101 may be formed by processing the first buffer film 101a into an island shape.

The first buffer film 101a and the second buffer layer 103 may be formed using the same material, or different materials selected from those described above. In the case where the first buffer film 101a and the second buffer layer 103 are formed using the same material (or materials with which sufficient etching selectivity cannot be obtained), the etching for processing the second buffer layer 103 into an island shape may be controlled by adjusting the etching time. When the second buffer layer 103 is formed by the processing, part of the first buffer film 101a might be etched and thus the thickness of a region where the first buffer film 101a does not overlap with the second buffer layer 103 might be smaller than that of a region where the first buffer film 101a overlaps with the second buffer layer 103.

In each of the transistors described in this embodiment, the buffer layer containing a constituent similar to that of the oxide semiconductor layer is provided on and in contact with the top surface and the bottom surface of the oxide semiconductor layer. By providing the buffer layer containing a material compatible with the oxide semiconductor layer in contact with the oxide semiconductor layer in this manner, the interface between the buffer layer and the oxide semiconductor layer can be made favorable. Thus, charge or the like generated due to the operation of a semiconductor device can be prevented from being trapped at the interface between the oxide semiconductor layer and the buffer layer. With such a structure, the oxide semiconductor layer can be less adversely affected by charge, which suppresses shift of the threshold value of the transistor due to trapping of charge at the interface of the oxide semiconductor layer.

In the case where the oxide semiconductor layer is a crystalline oxide semiconductor layer, the buffer layer containing a constituent similar to that of the oxide semiconductor layer, which is provided in contact with the oxide semiconductor layer, enables the crystallinity in the vicinity of the interface between the oxide semiconductor layer and the buffer layer to be improved. Therefore, crystalline regions can be formed at the interface between the oxide semiconductor layer and the buffer layer which are in contact with each other and in the bulk, and thus the level in a band of the crystalline oxide semiconductor layer can be reduced. Consequently, the transistor characteristics can be improved.

With the use of such a crystalline oxide semiconductor layer for a transistor, it is possible to provide a highly reliable semiconductor device in which changes of the electric characteristics of the transistor due to irradiation with visible light or ultraviolet light can be suppressed.

In this embodiment, the oxide semiconductor layer used for an active layer of the transistor is an oxide semiconductor layer highly purified to be electrically i-type (intrinsic) by removing impurities such as hydrogen, moisture, a hydroxyl group, and hydride (also referred to as a hydrogen compound) from the oxide semiconductor by heat treatment and supplying oxygen which is a main component material of the oxide semiconductor and is reduced through a step of removing impurities. The transistor including the oxide semiconductor layer highly purified in such a manner has electric characteristics which are less likely to change, and thus is electrically stable.

As described above, a semiconductor device including an oxide semiconductor, which has stable electric characteristics, can be provided. Accordingly, a semiconductor device with high reliability can be provided.

The methods and structures described in this embodiment can be combined as appropriate with any of the methods and structures described in the other embodiments.

Embodiment 4

In this embodiment, another embodiment of a semiconductor device and a method for manufacturing the semiconductor device will be described with reference to FIGS. 7A to 7C. In this embodiment, the same portions as those in Embodiment 3 and portions having functions similar to those in Embodiment 3 and the same steps as those in Embodiment 3 and steps similar to those in Embodiment 3 may be handled as in Embodiment 3, and repeated description is omitted. In addition, detailed description of the same portions is not repeated.

This embodiment shows an example in which in a method for manufacturing a semiconductor device according to one embodiment of the disclosed invention, oxygen (including at least one of an oxygen radical, an oxygen atom, and an oxygen ion) is introduced into an oxide semiconductor layer that has been subjected to dehydration or dehydrogenation treatment so that oxygen is supplied to the oxide semiconductor layer.

Through the dehydration or dehydrogenation treatment, oxygen that is a main component material of an oxide semiconductor might be eliminated and thus might be reduced. There is an oxygen deficiency in a portion where oxygen is eliminated in the oxide semiconductor layer and a donor level which causes variation in the electric characteristics of a transistor is formed owing to the oxygen deficiency.

Thus, oxygen is preferably supplied to the oxide semiconductor layer which has been subjected to the dehydration or dehydrogenation treatment. By supply of oxygen to the oxide semiconductor layer, oxygen deficiency in the oxide semiconductor layer can be filled. Accordingly, the use of the oxide semiconductor layer for the transistor can lead to a reduction in a variation in the threshold voltage Vth of the transistor and a shift of the threshold voltage ($\Delta$Vth) due to an oxygen vacancy. Further, the threshold voltage of the transistor can be shifted in the positive direction to make the transistor a normally-off transistor.

Figure 7A:
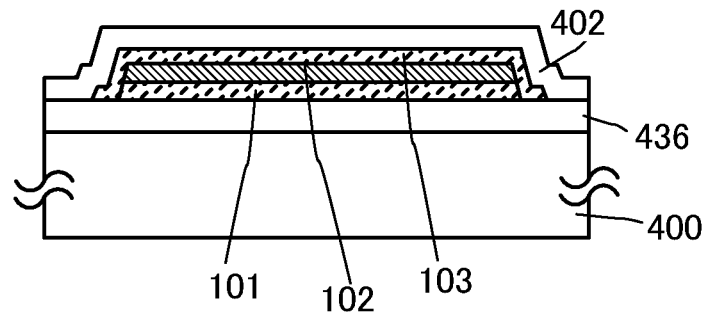
FIGS. 7A to 7C illustrate an example of a manufacturing process of a semiconductor device.

FIG. 7A corresponds to FIG. 4C, in which the first buffer layer 101, the oxide semiconductor layer 102, the second buffer layer 103, and the gate insulating film 402 are formed over the substrate 400 having an insulating surface on which the oxide insulating film 436 is provided.

Figure 7B:
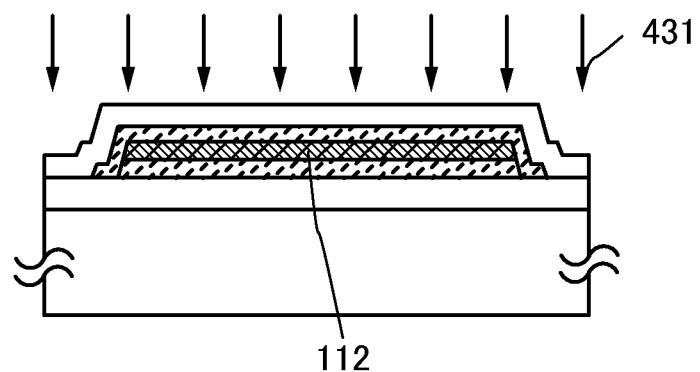
Figure 7C:
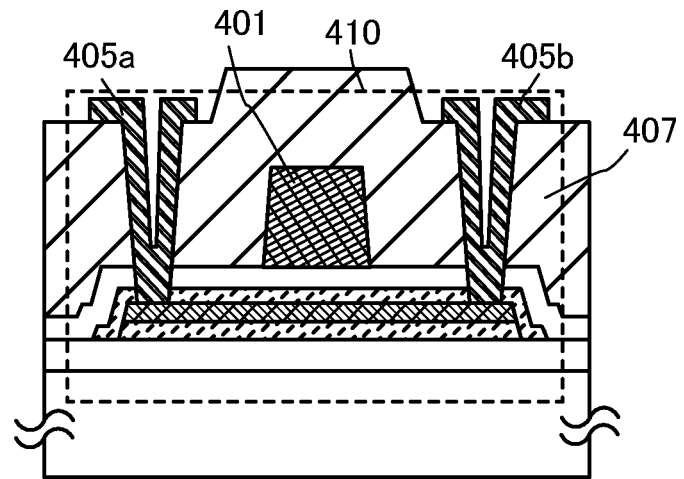

Next, oxygen 431 (including at least one of an oxygen radical, an oxygen atom, and an oxygen ion) is added to the oxide semiconductor layer 102; thus, oxygen is supplied to the oxide semiconductor layer 102 so that an oxygen-excess region 112 is formed in the oxide semiconductor layer 102 (see FIG. 7B).

The oxygen-excess region 112 at least partly includes a region containing oxygen in excess of the stoichiometric ratio in the oxide semiconductor in a crystalline state. Oxygen deficiency in the oxide semiconductor layer 102 or at an interface of the oxide semiconductor layer 102 can be filled with the oxygen 431 supplied to the oxygen-excess region 112. Note that in the step of adding oxygen to the oxide semiconductor layer 102, an oxygen-excess region may be formed in the first buffer layer 101 or/and the second buffer layer 103 in contact with the oxide semiconductor layer 102.

Next, the gate electrode layer 401 is formed in a region overlapping with the oxide semiconductor layer 102 which includes the oxygen-excess region 112. After that, the insulating film 407 is formed over the gate insulating film 402 and the gate electrode layer 401, and the source electrode layer 405a and the drain electrode layer 405b are formed so as to be electrically connected to the oxide semiconductor layer 102 through contact holes provided in the insulating film 407. Through these steps, a transistor 410 is manufactured (see FIG. 7C).

In the transistor described in this embodiment, oxygen is added to the dehydrated or dehydrogenated oxide semiconductor layer 102 to be supplied thereto, so that the oxide semiconductor layer 102 can be highly purified and be electrically i-type (intrinsic). Variation in the electric characteristics of the transistor 410 including the highly purified and electrically i-type (intrinsic) oxide semiconductor layer 102 is suppressed and the transistor 410 is thus electrically stable.

Oxygen can be added by an ion implantation method, an ion doping method, a plasma immersion ion implantation method, plasma treatment, or the like.

Although the step of adding the oxygen 431 to the oxide semiconductor layer 102 through the gate insulating film 402 is described in this embodiment, there is no particular limitation on the timing of the addition of oxygen to the oxide semiconductor layer 102 as long as it is performed after the dehydration or dehydrogenation treatment. Further, oxygen may be added plural times to the oxide semiconductor layer 102 after the dehydration or dehydrogenation treatment is performed. For example, the oxygen 431 may be added in the state where the oxide semiconductor layer 102 is exposed, or oxygen may be added to the oxide semiconductor layer 102 through the insulating film 407. Note that in the case where the oxygen 431 is added in the state where the oxide semiconductor layer 102 is exposed, plasma treatment can also be used.

Further, in the oxygen-excess region 112 of the oxide semiconductor layer 102, the concentration of oxygen added through the step of adding oxygen is preferably higher than or equal to $1 \times 10^{18}/cm^3$ and lower than or equal to $5 \times 10^{21}/cm^3$.

In the oxide semiconductor, oxygen is one of main component materials. Thus, it is difficult to accurately estimate the oxygen concentration in the oxide semiconductor layer 102 by a method such as secondary ion mass spectrometry (SIMS). In other words, it can be said that it is hard to determine whether or not oxygen is intentionally added to the oxide semiconductor layer 102.

It is known that there exist isotopes of oxygen, such as $^{17}O$ and $^{18}O$, and $^{17}O$ and $^{18}O$ account for about 0.037% and about 0.204% of all of the oxygen atoms in nature, respectively. That is to say, it is possible to measure the concentrations of these isotopes in the oxide semiconductor layer 102 by a method such as SIMS; therefore, the oxygen concentration in the oxide semiconductor layer 102 may be able to be estimated more accurately by measuring the concentration of such an isotope. Thus, the concentration of the isotope may be measured to determine whether or not oxygen is intentionally added to the oxide semiconductor layer 102.

Heat treatment is preferably performed after oxygen is added to the oxide semiconductor film. As the preferable heating conditions, the heating temperature is higher than or equal to 250° C. and lower than or equal to 700° C., more preferably higher than or equal to 300° C. and lower than or equal to 450° C., and the heating atmosphere is an oxygen atmosphere. Alternatively, the heat treatment may be performed under a nitrogen atmosphere, reduced pressure, or the air (ultra-dry air).

In the case where the oxide semiconductor layer is a crystalline oxide semiconductor layer, part of the crystalline oxide semiconductor layer might become amorphous by the addition of the oxygen 431. In this instance, the crystallinity of the oxide semiconductor layer can be recovered by performing heat treatment after the addition of the oxygen 431.

As described above, a semiconductor device formed using an oxide semiconductor layer, which has stable electric characteristics, can be provided. Accordingly, a semiconductor device with high reliability can be provided.

The methods and structures described in this embodiment can be combined as appropriate with any of the methods and structures described in the other embodiments.

Embodiment 5

In this embodiment, another embodiment of a semiconductor device and a method for manufacturing the semiconductor device will be described with reference to FIGS. 8A to 8C. In this embodiment, the same portions as those in the above embodiment and portions having functions similar to those in the above embodiment and the same steps as those in the above embodiment and steps similar to those in the above embodiment may be handled as in the above embodiment, and repeated description is omitted. In addition, detailed description of the same portions is not repeated.

Described in this embodiment is an example in which low-resistance regions are formed in an oxide semiconductor layer in a method for manufacturing a semiconductor device according to one embodiment of the disclosed invention. The low-resistance regions can be formed by adding an impurity (also called a dopant) for changing the electrical conductivity to the oxide semiconductor layer.

As in the manufacturing process described in Embodiment 3, the first buffer layer 101, the oxide semiconductor layer 102, the second buffer layer 103, the gate insulating film 402, and the gate electrode layer 401 are formed over the substrate 400 having an insulating surface on which the oxide insulating film 436 is provided.

Figure 8A:
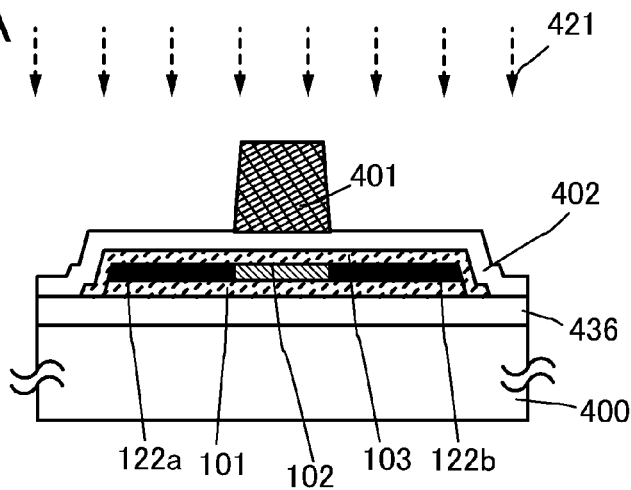
FIGS. 8A to 8C illustrate embodiments of a semiconductor device and an example of a manufacturing step thereof.

Next, a dopant 421 is selectively added to the oxide semiconductor layer 102 through the gate insulating film 402 and the second buffer layer 103 with the use of the gate electrode layer 401 as a mask, so that low-resistance regions 122a and 122b are formed (see FIG. 8A).

The dopant 421 is an impurity for changing the electrical conductivity of the oxide semiconductor layer 102. As the dopant 421, one or more selected from a Group 15 element (typically, phosphorus (P), arsenic (As), and antimony (Sb)), boron (B), aluminum (Al), nitrogen (N), argon (Ar), helium (He), neon (Ne), indium (In), fluorine (F), chlorine (CO, titanium (Ti), and zinc (Zn) can be used.

In this embodiment, the dopant 421 is added to the oxide semiconductor layer 102 through the gate insulating film 402 and the second buffer layer 103 by an implantation method. The dopant 421 can be added by an ion implantation method, an ion doping method, a plasma immersion ion implantation method, or the like. In that case, it is preferable to use a single ion of the dopant 421 or a fluoride ion or a chloride ion thereof.

The addition of the dopant 421 may be controlled by appropriately setting implantation conditions such as acceleration voltage and a dose, the thicknesses of the gate insulating film 402 and the second buffer layer 103 through which the dopant 421 passes, and the like. In this embodiment, boron is used as the dopant 421, whose ion is added by an ion implantation method. Note that the dose of the dopant 421 may be greater than or equal to $1 \times 10^{13}$ ions/cm$^2$ and less than or equal to $5 \times 10^{16}$ ions/cm$^2$.

The concentration of the dopant 421 in the low-resistance region 122a and that in the low-resistance region 122b are preferably higher than or equal to $5 \times 10^{18}/cm^3$ and lower than or equal to $1 \times 10^{22}/cm^3$.

The addition of the dopant 421 may be performed while the substrate 400 is heated.

The addition of the dopant 421 to the oxide semiconductor layer 102 may be performed plural times, and plural kinds of dopant may be used.

Depending on how deep the dopant 421 is added, the dopant 421 is included and a pair of low-resistance regions is formed also in a region of the first buffer layer 101 or the second buffer layer 103 which does not overlap with the gate electrode layer 401.

After the dopant 421 is added, heat treatment may be performed. As the preferable heating conditions, the heating temperature is higher than or equal to 300° C. and lower than or equal to 700° C., more preferably higher than or equal to 300° C. and lower than or equal to 450° C., the heating time is one hour, and the heating atmosphere is an oxygen atmosphere. Alternatively, the heat treatment may be performed under a nitrogen atmosphere, reduced pressure, or the air (ultra-dry air).

In the case where the oxide semiconductor layer 102 is a crystalline oxide semiconductor film, part of the crystalline oxide semiconductor film might become amorphous by the addition of the dopant 421. In this instance, the crystallinity of the oxide semiconductor layer 102 can be recovered by performing heat treatment after the addition of the dopant 421.

Figure 8B:
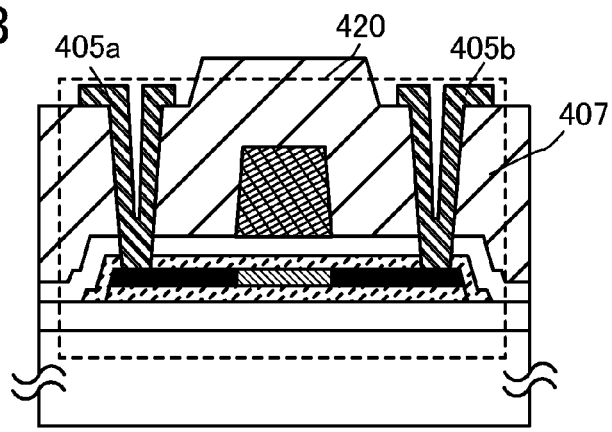

Next, the insulating film 407 is formed over the gate insulating film 402 and the gate electrode layer 401, and the source electrode layer 405a and the drain electrode layer 405b are formed so as to be electrically connected to the oxide semiconductor layer 102 through contact holes provided in the insulating film 407 (see FIG. 8B).

Through the above steps, a transistor 420 according to this embodiment can be manufactured. The oxide semiconductor layer 102 in the transistor 420 includes the low-resistance regions 122a and 122b between which a channel formation region 122c overlapping with the gate electrode layer 401 is sandwiched.

Figure 8C:
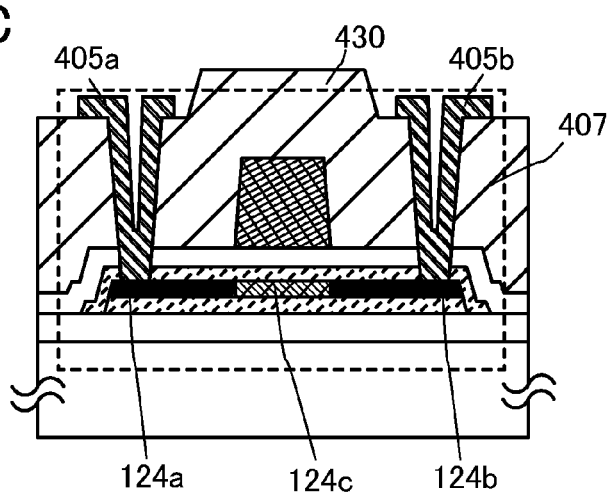

FIG. 8C illustrates a transistor 430 having a structure in which a dopant is added to the transistor 410 including the oxygen-excess region of Embodiment 4 and thus low-resistance regions are formed.

After the oxide semiconductor layer 102 including the oxygen-excess region 112 is formed through the steps illustrated in FIGS. 7A and 7B, a dopant is added with the use of the gate electrode layer 401 as a mask; thus, the transistor 430 includes low-resistance regions 124a and 124b including the dopant and excess oxygen, between which a channel formation region 124c including excess oxygen is sandwiched.

With an oxide semiconductor layer including low-resistance regions between which a channel formation region is sandwiched in the channel length direction, the transistors 420 and 430 described in this embodiment have excellent on-state characteristics (e.g., on-state current and field-effect mobility) and enable high-speed operation and high-speed response. Further, the low-resistance regions are formed in a self-aligned manner and do not overlap with the gate electrode layer; thus, parasitic capacitance can be reduced. A reduction in parasitic capacitance leads to lowering of power consumption of the whole semiconductor device.

The methods and structures described in this embodiment can be combined as appropriate with any of the methods and structures described in the other embodiments.

Embodiment 6

A semiconductor device having a display function (also referred to as a display device) can be manufactured using any of the transistors described in Embodiments 1 to 5. Moreover, part or all of the driver circuitry which includes the transistor can be formed over a substrate where a pixel portion is formed, whereby a system-on-panel can be formed.

Figure 9A:
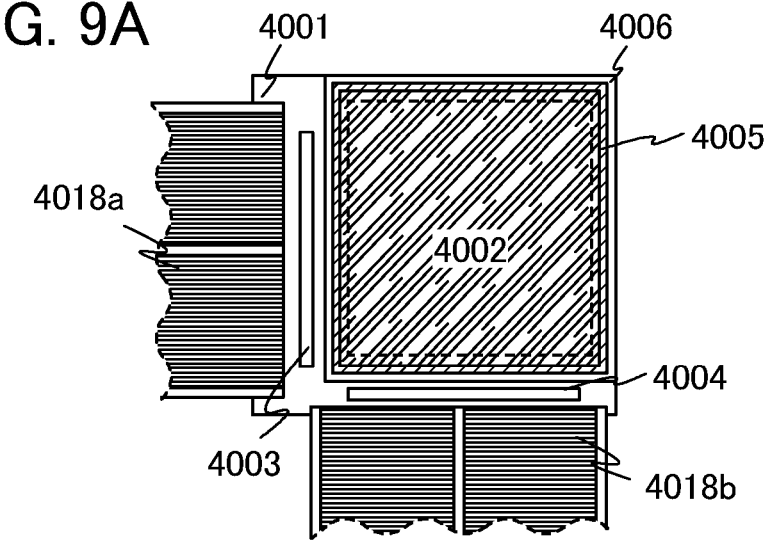
FIGS. 9A to 9C each illustrate one embodiment of a semiconductor device.

In FIG. 9A, a sealant 4005 is provided so as to surround a pixel portion 4002 provided over a first substrate 4001, and the pixel portion 4002 is sealed with a second substrate 4006. In FIG. 9A, a signal line driver circuit 4003 and a scan line driver circuit 4004 which are each formed using a single crystal semiconductor film or a polycrystalline semiconductor film over a substrate separately prepared are mounted in a region that is different from the region surrounded by the sealant 4005 over the first substrate 4001. Various signals and potential are supplied to the signal line driver circuit 4003 and the scan line driver circuit 4004 each of which is separately formed, and the pixel portion 4002 from flexible printed circuits (FPCs) 4018a and 4018b.

Figure 9B:
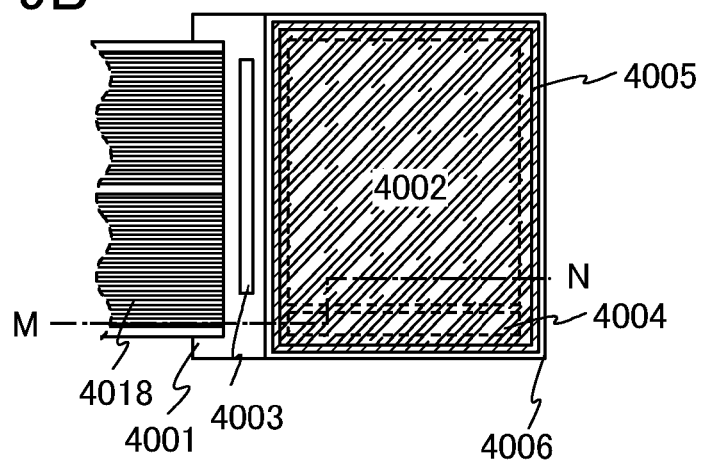
Figure 9C:
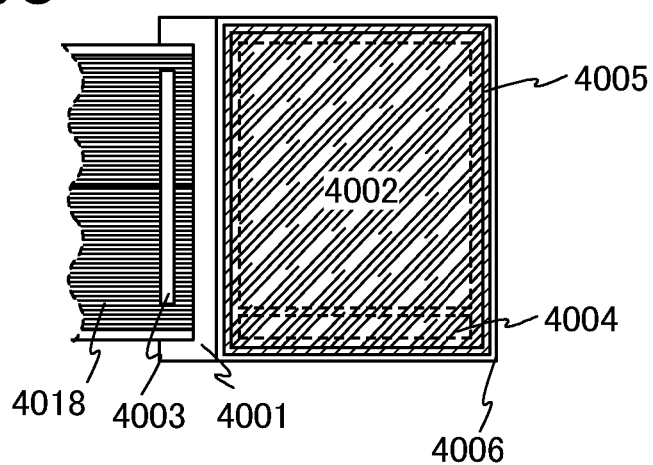

In FIGS. 9B and 9C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element by the first substrate 4001, the sealant 4005, and the second substrate 4006. In FIGS. 9B and 9C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 9B and 9C, various signals and potentials are supplied to the signal line driver circuit 4003 which is separately formed, the scan line driver circuit 4004, and the pixel portion 4002 from an FPC 4018.

Although FIGS. 9B and 9C each illustrate an example in which the signal line driver circuit 4003 is formed separately and mounted on the first substrate 4001, one embodiment of the present invention is not limited to this structure. The scan line driver circuit may be formed separately and then mounted, or only part of the signal line driver circuit or part of the scan line driver circuit may be formed separately and then mounted.

Note that there is no particular limitation on a connection method of a separately formed driver circuit, and a chip on glass (COG) method, a wire bonding method, a tape automated bonding (TAB) method, or the like can be used. FIG. 9A illustrates an example in which the signal line driver circuit 4003 and the scan line driver circuit 4004 are mounted by a COG method. FIG. 9B illustrates an example in which the signal line driver circuit 4003 is mounted by a COG method. FIG. 9C illustrates an example in which the signal line driver circuit 4003 is mounted by a TAB method.

The display device includes in its category a panel in which a display element is sealed, and a module in which an IC such as a controller or the like is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and any of the transistors described in Embodiments 1 to 5 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Embodiments of the semiconductor device will be described with reference to FIGS. 9A to 9C and FIGS. 10A and 10B. FIGS. 10A and 10B correspond to cross-sectional views taken along line M-N in FIG. 9B.

As illustrated in FIGS. 9A to 9C and FIGS. 10A and 10B, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrode layers of transistors 4010 and 4011.

The pixel portion 4002 and the scan line driver circuit 4004 which are provided over the first substrate 4001 include a plurality of transistors. FIGS. 10A and 10B illustrate the transistor 4010 included in the pixel portion 4002 and the transistor 4011 included in the scan line driver circuit 4004 as an example. In FIG. 10A, an insulating film 4020 is provided over the transistors 4010 and 4011, and in FIG. 10B, insulating films 4020 and 4021 are provided over the transistors 4010 and 4011. Note that an insulating film 4023 is an insulating film serving as a gate insulating film.

Any of the transistors described in Embodiments 1 to 5 can be applied to the transistor 4010 and the transistor 4011. Described in this embodiment is an example in which a transistor having a structure similar to that of the transistor 212 described in Embodiment 2 is used. The transistors 4010 and 4011 are electrically stable. Accordingly, highly reliable semiconductor devices can be provided as the semiconductor devices of this embodiment.

The transistor 4010 included in the pixel portion 4002 is electrically connected to a display element to form a display panel. There is no particular limitation on the kind of display element as long as display can be performed, and various kinds of display elements can be employed.

An example of a liquid crystal display device using a liquid crystal element as a display element is illustrated in FIG. 10A. In FIG. 10A, a liquid crystal element 4013 which is a display element includes a first electrode layer 4030, a second electrode layer 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked with the liquid crystal layer 4008 interposed therebetween.

A columnar spacer denoted by reference numeral 4035 is obtained by selective etching of an insulating film and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor including an oxide semiconductor layer has a possibility that the electric characteristics of the transistor may fluctuate significantly by the influence of static electricity and deviate from the designed range. Therefore, it is more effective to use a liquid crystal composition exhibiting a blue phase for the liquid crystal display device including the transistor including an oxide semiconductor layer.

The specific resistivity of the liquid crystal material is higher than or equal to $1 \times 10^9$ Ω·cm, preferably higher than or equal to $1 \times 10^{11}$ Ωcm, further preferably higher than or equal to $1 \times 10^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. By using a transistor including an oxide semiconductor layer, which is disclosed in this specification, it is enough to provide a storage capacitor having a capacitance that is ⅓ or less, preferably ⅕ or less of liquid crystal capacitance of each pixel.

In the transistor including an oxide semiconductor layer, which is disclosed in this specification, the current in an off state (off-state current) can be made small. Accordingly, an electric signal such as an image signal can be held for a longer period, and a writing interval can be set longer in an on state. Accordingly, the frequency of refresh operation can be reduced, which leads to an effect of suppressing power consumption.

The transistor including an oxide semiconductor layer, which is disclosed in this specification, can have relatively high field-effect mobility; thus, the scan line driver circuit 4004 can operate at high speed. According to this embodiment, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may differ between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. Note that description is made here using an organic EL element as a light-emitting element.

In order to extract light emitted from the light-emitting element, at least one of the pair of electrodes has a light-transmitting property. A transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

An example of a light-emitting device using a light-emitting element as a display element is illustrated in FIG. 10B. A light-emitting element 4513 which is a display element is electrically connected to the transistor 4010 provided in the pixel portion 4002. A structure of the light-emitting element 4513 is not limited to the shown stacked-layer structure, which is the stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed.

Further, a layer containing an organic compound may be deposited by an evaporation method to cover the light-emitting element 4513 so that oxygen, hydrogen, moisture, carbon dioxide, and the like do not enter the light-emitting element 4513.

In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, electronic paper in which electronic ink is driven can be provided as the display device. The electronic paper is also referred to as an electrophoretic display device (electrophoretic display) and is advantageous in that it has the same level of readability as plain paper, it has lower power consumption than other display devices, and it can be made thin and lightweight.

Although the electrophoretic display device can have various modes, the electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 9A to 9C and FIGS. 10A and 10B, a flexible substrate as well as a glass substrate can be used as any of the first substrate 4001 and the second substrate 4006. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is interposed between PVF films or polyester films can be used.

In this embodiment, an aluminum oxide film is used as the insulating film 4020.

The aluminum oxide film provided as the insulating film 4020 over the oxide semiconductor film has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor layer and release of oxygen, which is a main component material of the oxide semiconductor, from the oxide semiconductor layer.

The insulating film 4021 serving as a planarization insulating film can be formed using an organic material having heat resistance, such as acrylic, polyimide, benzocyclobutene, polyamide, or epoxy. Other than such organic materials, it is also possible to use a low-dielectric constant material (low-k material), a siloxane-based resin, phosphosilicate glass (PSG), borophosphosilicate glass (BPSG), or the like. Note that the insulating film may be formed by stacking a plurality of insulating films formed using any of these materials.

The first electrode layer and the second electrode layer (which may be called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (referred to as ITO), indium zinc oxide, indium tin oxide to which silicon oxide is added, or graphene.

The first electrode layer 4030 and the second electrode layer 4031 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

Since the transistor is likely to be broken by static electricity or the like, a protection circuit for protecting the driver circuit is preferably provided. The protection circuit is preferably formed using a nonlinear element.

As described above, by using any of the transistors described in Embodiments 1 to 5, a semiconductor device with high reliability can be provided.

This embodiment can be implemented in appropriate combination with any of the structures described in the other embodiments.

Embodiment 7

A semiconductor device having an image sensor function of reading information on an object can be manufactured using any of the transistors described in Embodiments 1 to 5.

Figure 11A:
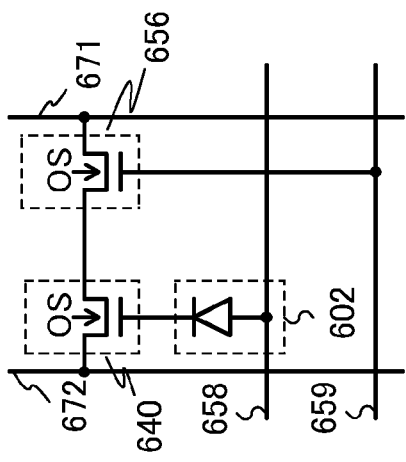
FIGS. 11A and 11B illustrate one embodiment of a semiconductor device.

FIG. 11A illustrates an example of a semiconductor device having an image sensor function. FIG. 11A is an equivalent circuit diagram of a photosensor, and FIG. 11B is a cross-sectional view of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

Note that in circuit diagrams in this specification, a transistor including an oxide semiconductor film is denoted by a symbol "OS" so that it can be identified as a transistor including an oxide semiconductor film. In FIG. 11A, the transistor 640 and the transistor 656 are each a transistor including an oxide semiconductor film, to which any of the transistors described in Embodiments 1 to 5 can be applied. Described in this embodiment is an example in which a transistor having a structure similar to that of the transistor 510 described in Embodiment 3 is used.

Figure 11B:
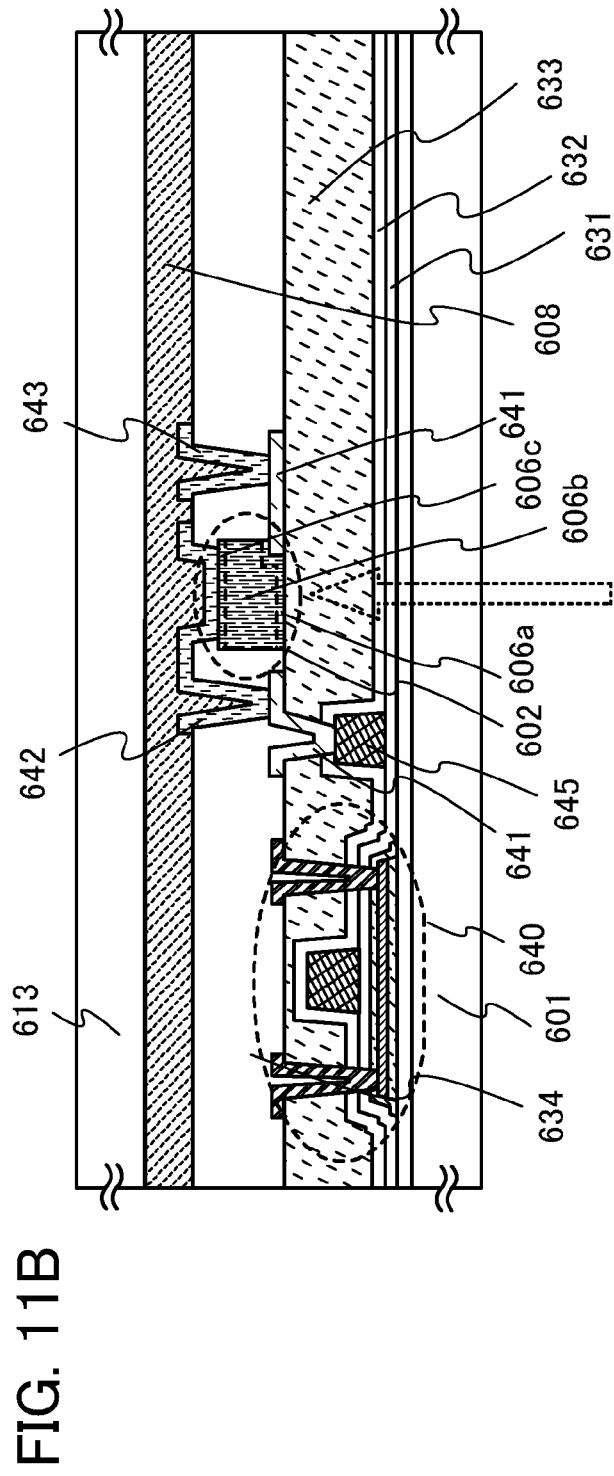

FIG. 11B is a cross-sectional view of the photodiode 602 and the transistor 640 in the photosensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating film 631, an insulating film 632, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between an electrode layer 641 formed over the interlayer insulating film 633 and an electrode layer 642 formed over the interlayer insulating film 634.

The electrode layer 641 is electrically connected to a conductive layer 643 formed over the interlayer insulating film 634, and the electrode layer 642 is electrically connected to a conductive layer 645 through the electrode layer 641. The conductive layer 645 is electrically connected to the gate of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Further, light from the semiconductor film having a conductivity type opposite to that of the semiconductor film on the light-receiving plane is disturbance light; therefore, the electrode layer is preferably formed using a light-blocking conductive film. Note that a surface on the n-type semiconductor film side can alternatively be used as the light-receiving plane.

With the use of an insulating material, the insulating film 632, the interlayer insulating film 633 and the interlayer insulating film 634 can be formed, depending on the material, by a method or a tool (equipment) such as a sputtering method, a plasma CVD method, an SOG method, spin coating, dipping, spray coating, a droplet discharge method (such as an inkjet method), a printing method (such as screen printing or offset printing), a doctor knife, a roll coater, a curtain coater, or a knife coater.

In this embodiment, an aluminum oxide film is used as the insulating film 631. The insulating film 631 can be formed by a sputtering method or a plasma CVD method.

The aluminum oxide film provided as the insulating film 631 over the oxide semiconductor film has a high shielding effect (blocking effect) of preventing penetration of both oxygen and impurities such as hydrogen and moisture.

Therefore, in and after the manufacturing process, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

The insulating film 632 can be formed using an inorganic insulating material and can have a single-layer structure or a stacked-layer structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

For a reduction in surface roughness, an insulating film functioning as a planarization insulating film is preferably used as each of the interlayer insulating films 633 and 634. For the interlayer insulating films 633 and 634, for example, an organic insulating material having heat resistance such as polyimide, an acrylic resin, a benzocyclobutene resin, polyamide, or an epoxy resin can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

With detection of light that enters the photodiode 602, information on an object to be detected can be read. Note that a light source such as a backlight can be used at the time of reading information on an object to be detected.

As described above, by using any of the transistors described in Embodiments 1 to 5, a semiconductor device with high reliability can be provided.

This embodiment can be implemented in appropriate combination with any of the structures described in the other embodiments.

Embodiment 8

A semiconductor device disclosed in this specification can be applied to a variety of electronic devices (including game machines). Examples of electronic devices include a television set (also referred to as a television or a television receiver), a monitor of a computer or the like, a monitor mounted on a robot, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic devices are shown in FIGS. 12A to 12D.

Figure 12A:
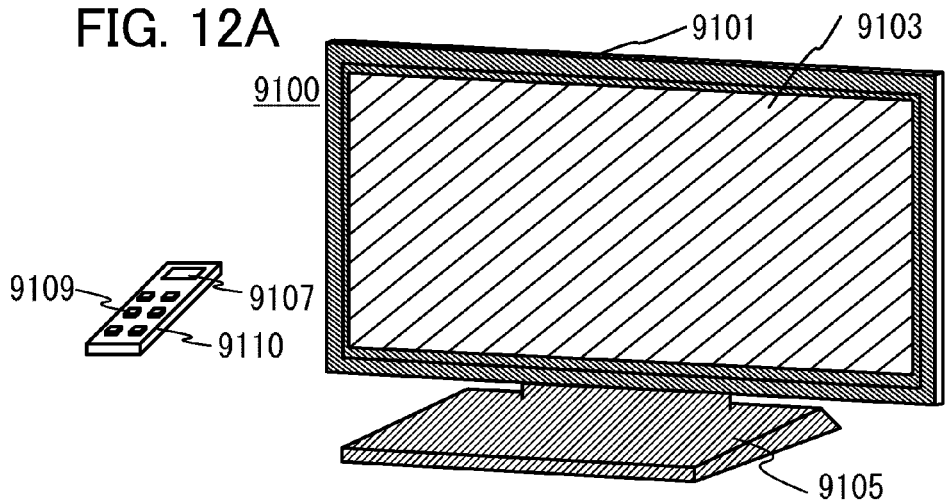
FIGS. 12A to 12D illustrate electronic devices.

FIG. 12A illustrates a television set 9100. In the television set 9100, a display portion 9103 is incorporated in a housing 9101. A semiconductor device manufactured using one embodiment of the present invention can be used in the display portion 9103, so that an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 12A is provided with a receiver, a modem, and the like. With the receiver, the television set 9100 can receive a general television broadcast. Further, when the television set 9100 is connected to a communication network with or without wires via the modem, one-way (from a transmitter to a receiver) or two-way (between a transmitter and a receiver or between receivers) data communication can be performed.

By using the semiconductor device described in the above embodiment, a television set with high reliability can be provided.

Figure 12B:
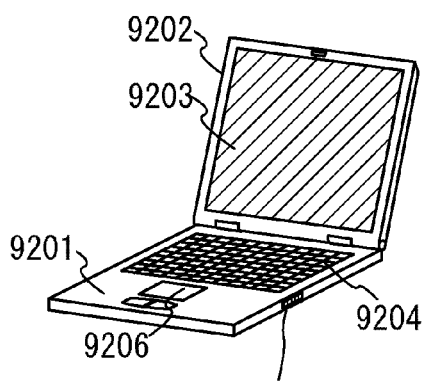

FIG. 12B illustrates a computer which includes a main body 9201, a housing 9202, a display portion 9203, a keyboard 9204, an external connection port 9205, a pointing device 9206, and the like. The computer is manufactured using a semiconductor device manufactured according to one embodiment of the present invention for the display portion 9203.

By using the semiconductor device described in the above embodiment, a computer with high reliability can be provided.

Figure 12D:
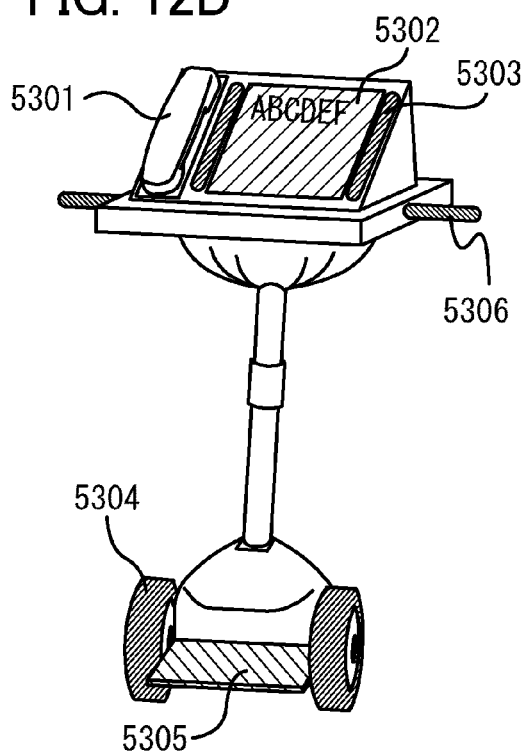
Figure 12C:
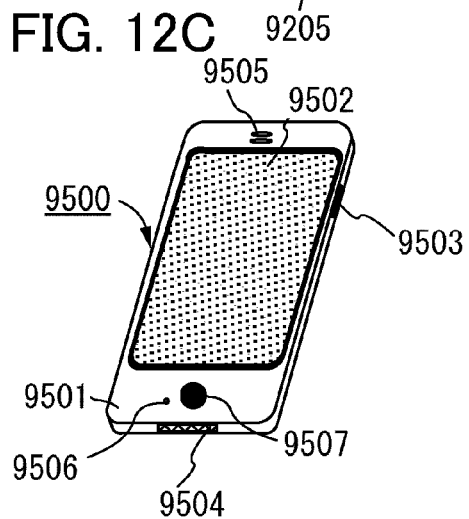

FIG. 12C illustrates an example of a mobile phone. A mobile phone 9500 is provided with a display portion 9502 incorporated in a housing 9501, operation buttons 9503 and 9507, an external connection port 9504, a speaker 9505, a microphone 9506, and the like. Note that the mobile phone 9500 is manufactured using a semiconductor device manufactured according to one embodiment of the present invention for the display portion 9502.

Users can input data, make a call, or text a message by touching the display portion 9502 of the mobile phone 9500 illustrated in FIG. 12C with their fingers or the like.

There are mainly three screen modes for the display portion 9502. The first mode is a display mode mainly for displaying images. The second mode is an input mode mainly for inputting data such as text. The third mode is a display-and-input mode in which two modes of the display mode and the input mode are combined.

For example, in the case of making a call or text messaging, a text input mode mainly for inputting text is selected for the display portion 9502 so that characters displayed on a screen can be input. In this case, it is preferable to display a keyboard or number buttons on almost the entire screen of the display portion 9502.

By providing a detection device which includes a sensor for detecting inclination, such as a gyroscope or an acceleration sensor, inside the mobile phone 9500, the direction of the mobile phone 9500 (whether the mobile phone 9500 is placed horizontally or vertically for a landscape mode or a portrait mode) is determined so that display on the screen of the display portion 9502 can be automatically switched.

In addition, the screen mode is switched by touching the display portion 9502 or operating the operation button 9503 of the housing 9501. Alternatively, the screen modes can be switched depending on kinds of images displayed on the display portion 9502. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 9502 is not performed within a specified period of time while a signal detected by an optical sensor in the display portion 9502 is detected, the screen mode may be controlled so as to be switched from the input mode to the display mode.

The display portion 9502 can also function as an image sensor. For example, an image of a palm print, a fingerprint, or the like is taken by touching the display portion 9502 with the palm or the finger, whereby personal authentication can be performed. Further, by providing a backlight or a sensing light source which emits near-infrared light in the display portion, an image of a finger vein, a palm vein, or the like can be taken.

FIG. 12D illustrates an example of a robot having a monitor. The robot in FIG. 12D includes a display portion 5302, a receiver 5301, speakers 5303, wheels 5304, a board 5305 on which a user stands, and operating handles 5306. The robot in FIG. 12D incorporates a rechargeable battery, a motion sensor, a location sensor such as a GPS, and the like.

The robot can be used indoor, such as in a large office inside a building, and functions as a guide robot when being fixed. It is possible to input information, make a phone call, or listen to audio guidance output from the speakers 5303 by touching the display portion 5302 with a finger or the like.

When a user stands on the board 5305 and grasps the operating handles 5306, the user can ride on the robot and move in that state. Although the number of the wheels 5304 is two in this example, the robot may include, without particular limitation, three, four, or more wheels. The robot is manufactured using a semiconductor device manufactured according to one embodiment of the present invention in the display portion 5302.

The methods and structures described in this embodiment can be combined as appropriate with any of the methods and structures described in the other embodiments.

This application is based on Japanese Patent Application serial no. 2011-156283 filed with Japan Patent Office on Jul. 15, 2011, the entire contents of which are hereby incorporated by reference.

What is claimed is:

1. A semiconductor device comprising:
a metal oxide layer;
an oxide semiconductor layer containing indium, titanium, and zinc, the oxide semiconductor layer being provided over the metal oxide layer;
a first electrode and a second electrode over the oxide semiconductor layer and the metal oxide layer,
a gate insulating film over and in contact with the oxide semiconductor layer, the first electrode and the second electrode; and
a gate electrode layer over the gate insulating film.

2. The semiconductor device according to claim 1, wherein the metal oxide layer contains an oxide of at least one element selected from titanium, aluminum, gallium, zirconium, hafnium, and a rare earth element.

3. The semiconductor device according to claim 1, wherein the oxide semiconductor layer at least partly includes a region containing oxygen in excess of a stoichiometric ratio in a crystalline state.

4. The semiconductor device according to claim 1, wherein the oxide semiconductor layer is a crystalline semiconductor layer.

5. The semiconductor device according to claim 1, wherein the oxide semiconductor layer includes low-resistance regions,
wherein the low-resistance regions sandwich a channel formation region overlapping with the gate electrode layer, and
wherein the low-resistance regions include one or more selected from phosphorus (P), arsenic (As), antimony (Sb), boron (B), aluminum (Al), nitrogen (N), argon (Ar), helium (He), neon (Ne), indium (In), fluorine (F), chlorine (Cl), titanium (Ti), and zinc (Zn).

6. A semiconductor device comprising:
a first metal oxide layer;
an oxide semiconductor layer containing indium, titanium, and zinc, the oxide semiconductor layer being provided over the first metal oxide layer;
a second metal oxide layer provided over the oxide semiconductor layer so as to cover a side surface of the oxide semiconductor layer;
a gate insulating film over the second metal oxide layer;
a gate electrode layer over the gate insulating film;
an insulating film over the gate electrode layer, the insulating film having openings; and
a source electrode layer and a drain electrode layer provided over the insulating film to be electrically connected to the oxide semiconductor layer through the openings.

7. The semiconductor device according to claim 6,
wherein the first metal oxide layer contains an oxide of at least one element selected from titanium, aluminum, gallium, zirconium, hafnium, and a rare earth element, and
wherein the second metal oxide layer contains an oxide of at least one element selected from titanium, aluminum, gallium, zirconium, hafnium, and a rare earth element.

8. The semiconductor device according to claim 6,
wherein the oxide semiconductor layer at least partly includes a region containing oxygen in excess of a stoichiometric ratio in a crystalline state.

9. The semiconductor device according to claim 6,
wherein the oxide semiconductor layer is a crystalline semiconductor layer.

10. The semiconductor device according to claim 6,
wherein the oxide semiconductor layer includes low-resistance regions, and
wherein the low-resistance regions sandwich a channel formation region overlapping with the gate electrode layer, and
wherein the low-resistance regions include one or more selected from phosphorus (P), arsenic (As), antimony (Sb), boron (B), aluminum (Al), nitrogen (N), argon (Ar), helium (He), neon (Ne), indium (In), fluorine (F), chlorine (Cl), titanium (Ti), and zinc (Zn).

11. A semiconductor device comprising:
a first metal oxide layer;
an oxide semiconductor layer containing indium, titanium, and zinc, the oxide semiconductor layer being provided over the first metal oxide layer;
a second metal oxide layer provided over the oxide semiconductor layer so as to cover a side surface of the first metal oxide layer and a side surface of the oxide semiconductor layer;
a gate insulating film over the second metal oxide layer;
a gate electrode layer over the gate insulating film;
an insulating film over the gate electrode layer, the insulating film having openings; and
a source electrode layer and a drain electrode layer provided over the insulating film to be electrically connected to the oxide semiconductor layer through the openings.

12. The semiconductor device according to claim 11,
wherein the first metal oxide layer contains an oxide of at least one element selected from titanium, aluminum, gallium, zirconium, hafnium, and a rare earth element, and wherein the second metal oxide layer contains an oxide of at least one element selected from titanium, aluminum, gallium, zirconium, hafnium, and a rare earth element.

13. The semiconductor device according to claim 11, wherein the oxide semiconductor layer at least partly includes a region containing oxygen in excess of a stoichiometric ratio in a crystalline state.

14. The semiconductor device according to claim 11, wherein the oxide semiconductor layer is a crystalline semiconductor layer.

15. The semiconductor device according to claim 11, wherein the oxide semiconductor layer includes low-resistance regions, and wherein the low-resistance regions sandwich a channel formation region overlapping with the gate electrode layer, and wherein the low-resistance regions include one or more selected from phosphorus (P), arsenic (As), antimony (Sb), boron (B), aluminum (Al), nitrogen (N), argon (Ar), helium (He), neon (Ne), indium (In), fluorine (F), chlorine (Cl), titanium (Ti), and zinc (Zn).

* * * * *